United States Patent
Oshiyama

(10) Patent No.: US 12,389,699 B2
(45) Date of Patent: Aug. 12, 2025

(54) SOLID-STATE IMAGING DEVICE AND ELECTRONIC APPARATUS

(71) Applicant: SONY SEMICONDUCTOR SOLUTIONS CORPORATION, Kanagawa (JP)

(72) Inventor: Itaru Oshiyama, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 18/049,706

(22) Filed: Oct. 26, 2022

(65) Prior Publication Data

US 2023/0143614 A1    May 11, 2023

Related U.S. Application Data

(63) Continuation of application No. 16/959,709, filed as application No. PCT/JP2018/048418 on Dec. 28, 2018, now Pat. No. 11,508,768.

(30) Foreign Application Priority Data

Jan. 11, 2018   (JP) ................. 2018-002367

(51) Int. Cl.
   *H10F 39/00*   (2025.01)
   *H10F 30/20*   (2025.01)
(52) U.S. Cl.
   CPC ......... *H10F 39/8053* (2025.01); *H10F 30/20* (2025.01); *H10F 39/811* (2025.01)
(58) Field of Classification Search
   CPC .... H10F 39/8053; H10F 39/811; H10F 39/18; H10F 39/199; H10F 39/807;
   (Continued)

(56) References Cited

U.S. PATENT DOCUMENTS 11,075,242 B2 *   7/2021   Kuo ................. H01L 27/14685
11,189,657 B2 *   11/2021  Cheng .............. H01L 27/14632
(Continued)

FOREIGN PATENT DOCUMENTS

CN   101800233 A   8/2010
CN   102376726 A   3/2012
(Continued)

OTHER PUBLICATIONS

Extended European Search Report of EP Application No. 18899620.1, issued on Feb. 1, 2021, 06 pages.
(Continued)

*Primary Examiner* — Dao H Nguyen
(74) *Attorney, Agent, or Firm* — CHIP LAW GROUP

(57) ABSTRACT

The present technology relates to a solid-state imaging device and an electronic apparatus capable of improving sensitivity while suppressing deterioration of color mixing. The solid-state imaging device includes: a substrate; a first photoelectric conversion region that is provided in the substrate; a second photoelectric conversion region that is provided in the substrate; a trench that is provided between the first photoelectric conversion region and the second photoelectric conversion region and penetrates through the substrate; a first concave portion region that has a plurality of concave portions provided on a light receiving surface side of the substrate, above the first photoelectric conversion region; and a second concave portion region that has a plurality of concave portions provided on the light receiving surface side of the substrate, above the second photoelectric conversion region. The technology of the present disclosure can be applied to, for example, a backside illumination solid-state imaging device and the like.

9 Claims, 24 Drawing Sheets

(58) Field of Classification Search
CPC .... H10F 39/8057; H10F 39/805; H10F 39/12; H10F 30/20; H04N 25/70
See application file for complete search history.

(56) References Cited

U.S. PATENT DOCUMENTS

| | | | |
|---|---|---|---|
| 2010/0201834 A1* | 8/2010 | Maruyama | H01L 27/1464 257/E31.127 |
| 2015/0048427 A1 | 2/2015 | Hu et al. | |
| 2015/0085168 A1 | 3/2015 | Watanabe et al. | |
| 2015/0243694 A1* | 8/2015 | Ihara | H01L 27/14621 257/443 |
| 2016/0079300 A1 | 3/2016 | Watanabe et al. | |
| 2016/0112614 A1* | 4/2016 | Masuda | H04N 25/70 348/374 |
| 2016/0172391 A1 | 6/2016 | Ihara | |
| 2017/0045644 A1 | 2/2017 | Kageyama | |
| 2017/0110502 A1 | 4/2017 | Watanabe et al. | |
| 2017/0170220 A1 | 6/2017 | Nam et al. | |
| 2017/0309674 A1 | 10/2017 | Watanabe et al. | |
| 2018/0027157 A1 | 1/2018 | Masuda et al. | |
| 2018/0324339 A1 | 11/2018 | Masuda et al. | |
| 2019/0027518 A1 | 1/2019 | Miyata et al. | |
| 2019/0252424 A1 | 8/2019 | Miyata et al. | |
| 2021/0351218 A1* | 11/2021 | Kuo | H01L 27/1463 |

FOREIGN PATENT DOCUMENTS

| | | |
|---|---|---|
| CN | 102623463 A | 8/2012 |
| CN | 102867834 A | 1/2013 |
| CN | 104377211 A | 2/2015 |
| CN | 104882460 A | 9/2015 |
| CN | 105229790 A | 1/2016 |
| CN | 105895640 A | 8/2016 |
| CN | 108463887 A | 8/2018 |
| CN | 110676271 A | 1/2020 |
| EP | 2216818 A2 | 8/2010 |
| EP | 2657972 A1 | 10/2013 |
| EP | 3407386 A1 | 11/2018 |
| HK | 1207469 A1 | 1/2016 |
| JP | 2010-272612 A | 12/2010 |
| JP | 2011-003860 A | 1/2011 |
| JP | 2013-033864 A | 2/2013 |
| JP | 2015-029054 A | 2/2015 |
| JP | 2015-162679 A | 9/2015 |
| JP | 6794997 B2 | 12/2020 |
| KR | 10-2010-0091891 A | 8/2010 |
| KR | 20140015326 A | 2/2014 |
| KR | 10-2015-0101681 A | 9/2015 |
| KR | 10-2017-0070685 A | 6/2017 |
| TW | 201104852 A | 2/2011 |
| TW | 201507115 A | 2/2015 |
| TW | 201543659 A | 11/2015 |
| WO | 2015/001987 A1 | 1/2015 |
| WO | 2017/126329 A1 | 7/2017 |

OTHER PUBLICATIONS

International Search Report and Written Opinion of PCT Application No. PCT/JP2018/048418, issued on Mar. 12, 2019, 09 pages of English Translation and 08 pages of ISRWO.
International Preliminary Report on Patentability of PCT Application No. PCT/JP2018/048418, issued on Jul. 23, 2020, 09 pages of English Translation and 05 pages of IPRP.
Non-Final Office Action for U.S. Appl. No. 16/959,709, issued on Mar. 3, 2022, 10 pages.
Notice of Allowance for U.S. Appl. No. 16/959,709, issued on Jul. 25, 2022, 05 pages.

\* cited by examiner

SOLID-STATE IMAGING DEVICE AND ELECTRONIC APPARATUS

CROSS REFERENCE TO RELATED APPLICATIONS

This application is a continuation application of U.S. patent application Ser. No. 16/959,709, filed on Jul. 2, 2020, which is a U.S. National Phase of International Patent Application No. PCT/JP2018/048418 filed on Dec. 28, 2018, which claims priority benefit of Japanese Patent Application No. JP 2018-002367 filed in the Japan Patent Office on Jan. 11, 2018. Each of the above-referenced applications is hereby incorporated herein by reference in its entirety.

TECHNICAL FIELD

The present technology relates to a solid-state imaging device and an electronic apparatus, and, for example, to a solid-state imaging device and an electronic apparatus capable of improving sensitivity while suppressing deterioration of color mixing.

BACKGROUND ART

In a solid-state imaging device, as a structure for preventing reflection of incident light, it has been proposed to provide a fine concave-convex structure at an interface on a light receiving surface side of a silicon layer on which a photodiode is formed (for example, Patent Documents 1 and 2).

CITATION LIST

Patent Document

Patent Document 1: Japanese Patent Application Laid-Open No. 2010-272612
Patent Document 2: Japanese Patent Application Laid-Open No. 2013-33864

SUMMARY OF THE INVENTION

Problems to be Solved by the Invention

However, the fine concave-convex structure can improve sensitivity by preventing the reflection of incident light, but scattering becomes also large and an amount of light leaking into adjacent pixels is increased, and thus, there has been a possibility that color mixing would be deteriorated.

The present disclosure has been made in view of such a situation, and an object of the present disclosure is to improve sensitivity while suppressing deterioration of color mixing.

Solutions to Problems

A solid-state imaging device according to an aspect o the present technology includes: a substrate; a first photoelectric conversion region that is provided in the substrate; a second photoelectric conversion region that is provided in the substrate; a trench that is provided between the first photoelectric conversion region and the second photoelectric conversion region and penetrates through the substrate; a first concave portion region that has a plurality of concave portions provided on a light receiving surface side of the substrate, above the first photoelectric conversion region; and a second concave portion region that has a plurality of concave portions provided on the light receiving surface side of the substrate, above the second photoelectric conversion region.

An electronic apparatus according to an aspect of the present technology includes the solid-state imaging device described above.

The solid-state imaging device according to an aspect of the present technology includes the first photoelectric conversion region and the second photoelectric conversion region provided in the substrate, the trench provided between the first photoelectric conversion region and the second photoelectric conversion region and penetrating through the substrate, the first concave portion region having the plurality of concave portions provided on the light receiving surface side of the substrate, above the first photoelectric conversion region, and the second concave portion region having the plurality of concave portions provided on the light receiving surface side of the substrate, above the second photoelectric conversion region.

The electronic apparatus according to an aspect of the present technology includes the solid-state imaging device described above.

Note that the solid-state imaging device and the electronic apparatus may be independent devices or may be internal blocks configuring one device.

Effects of the Invention

According to the embodiments of the present technology, it is possible to improve sensitivity while suppressing deterioration of color mixing.

Note that an effect described here is not necessarily limited, and may be any effect described in the present disclosure.

MODE FOR CARRYING OUT THE INVENTION

Hereinafter, modes (hereinafter, referred to as embodiments) for carrying out the present technology will be described.

<Schematic Configuration Example of Solid-State Imaging Device>

Figure 1:
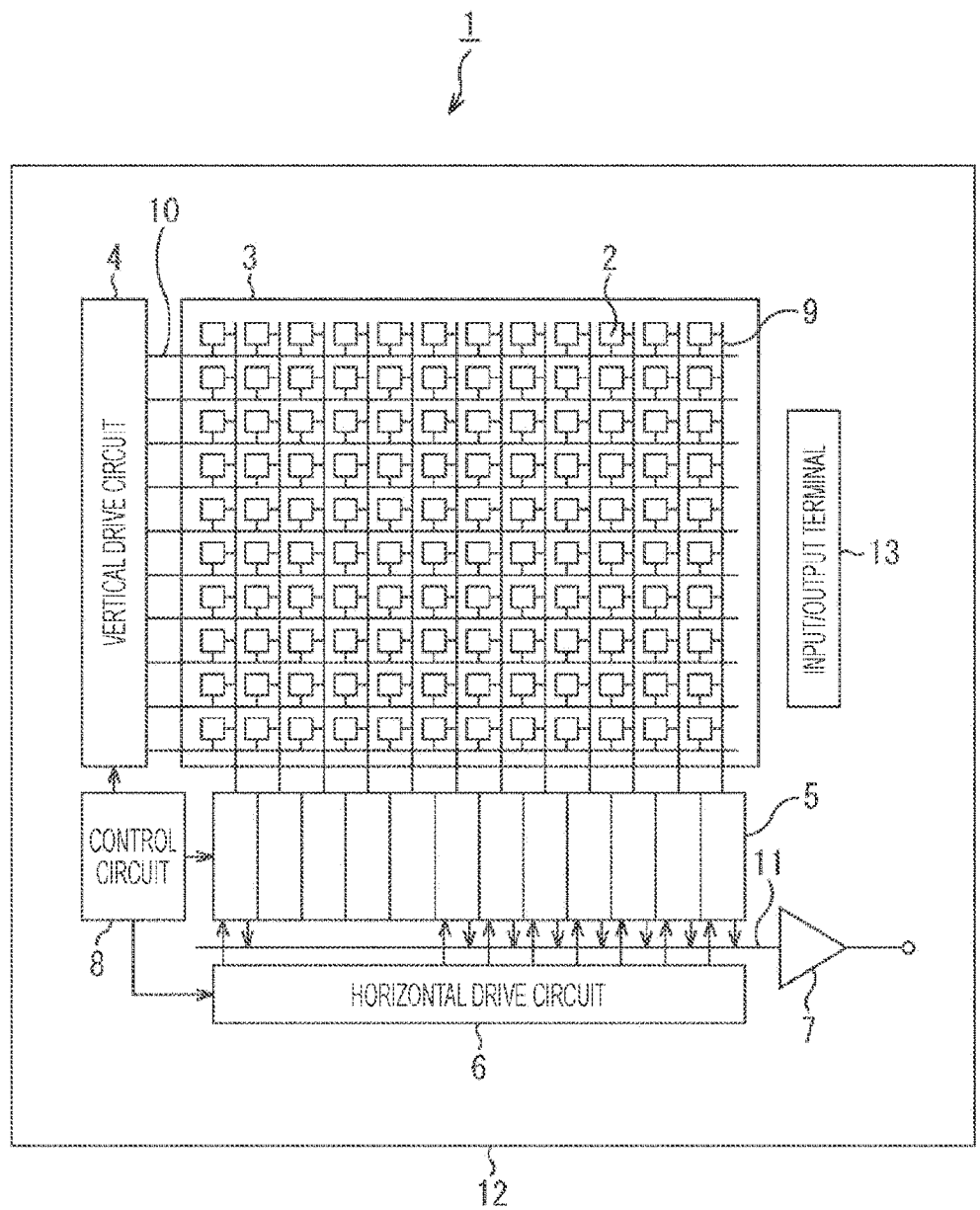
FIG. 1 is a diagram illustrating a schematic configuration of a solid-state imaging device according to the present disclosure.

FIG. 1 illustrates a schematic configuration of a solid-state imaging device according to the present disclosure.

The solid-state imaging device 1 of FIG. 1 includes a pixel array unit 3 in which pixels 2 are arranged in a two-dimensional array shape and a peripheral circuit unit arranged around the pixel array unit 3, on a semiconductor substrate 12 using, for example, silicon (Si) as a semiconductor. The peripheral circuit unit includes a vertical drive circuit 4, column signal processing circuits 5, a horizontal drive circuit 6, an output circuit 7, a control circuit 8, and the like.

The pixel 2 includes a photodiode as a photoelectric conversion element and a plurality of pixel transistors. The plurality of pixel transistors includes, for example, four metal oxide semiconductor (MOS) transistors, that is, a transfer transistor, a selection transistor, a reset transistor, and an amplification transistor.

Furthermore, the pixel 2 can also have a shared pixel structure. This shared pixel structure includes a plurality of photodiodes, a plurality of transfer transistors, one shared floating diffusion region, and one other pixel transistor that is shared. That is, in a shared pixel, photodiodes and transfer transistors that configure a plurality of unit pixels are configured to share one other pixel transistor with each other.

The control circuit 8 receives an input clock and data instructing an operation mode and the like, and outputs data such as internal information of the solid-state imaging device 1. That is, the control circuit 8 generates a clock signal or a control signal which is a reference for operations of the vertical drive circuit 4, the column signal processing circuits 5, the horizontal drive circuit 6, and the like, on the basis of a vertical synchronization signal, a horizontal synchronization signal, and a master clock. Then, the control circuit 8 outputs the generated clock signal or control signal to the vertical drive circuit 4, the column signal processing circuits 5, the horizontal drive circuit 6, and the like.

The vertical drive circuit 4 is configured by, for example, a shift register, selects pixel drive wirings 10, supplies pulses for driving the pixels 2 to the selected pixel drive wirings 10, and drives the pixels 2 in row units. That is, the vertical drive circuit 4 selectively scans each pixel 2 of the pixel array unit 3 sequentially in the vertical direction in row units, and supplies pixel signals based on signal charges generated according to amounts of received light in a photoelectric conversion unit of each pixel 2 to the column signal processing circuits 5 through vertical signal lines 9.

The column signal processing circuit 5 is arranged for every column of the pixels 2, and performs signal processing such as noise removal on signals output from the pixels 2 of one row for every pixel column. For example, the column signal processing circuit 5 performs signal processing such as correlated double sampling (CDS) processing, and analog-to-digital (AD) conversion processing, for removing fixed pattern noise unique to the pixels.

The horizontal drive circuit 6 is configured by, for example, a shift register, sequentially selects each of the column signal processing circuits 5 by sequentially outputting horizontal scanning pulses, and outputs pixel signals from each of the column signal processing circuits 5 to a horizontal signal line 11.

The output circuit 7 performs signal processing on the signals sequentially supplied from each of the column signal processing circuits 5 through the horizontal signal line 11, and outputs the processed signals. For example, the output circuit 7 may perform only buffering or may perform black level adjustment, column variation correction, various digital signal processing, and the like. An input/output terminal 13 exchanges signals with the outside.

The solid-state imaging device 1 configured as described above is a CMOS image sensor called a column AD manner in which the column signal processing circuit 5 performing the CDS processing and the AD conversion processing is arranged for every pixel column.

Furthermore, the solid-state imaging device 1 is a backside illumination MOS solid-state imaging device in which light is incident from a back surface side opposite to a front surface side of the semiconductor substrate 12 on which the pixel transistors are formed.

<Pixel Structure According to First Embodiment>

Figure 2:
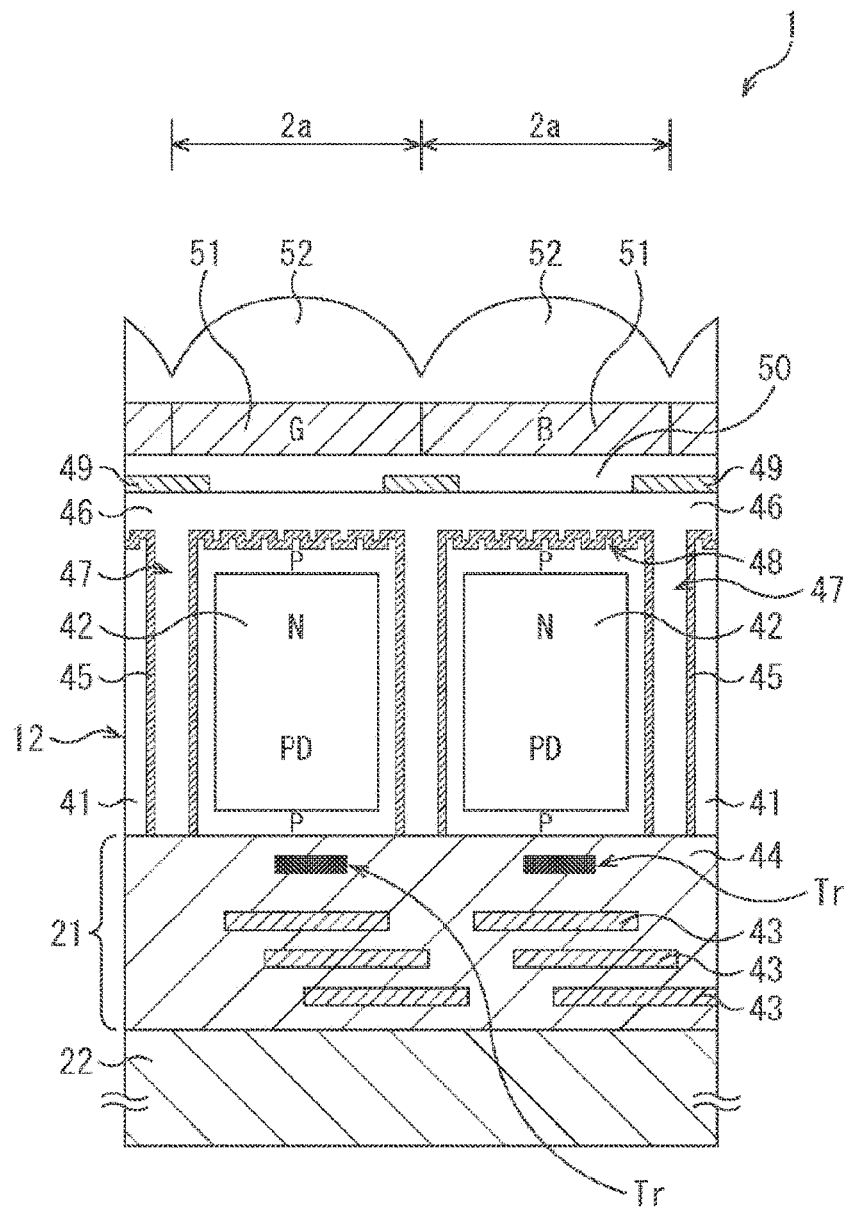
FIG. 2 is a diagram illustrating a cross-sectional configuration example of a pixel according to a first embodiment.

FIG. 2 is a diagram illustrating a cross-sectional configuration example of a pixel 2a according to a first embodiment.

The solid-state imaging device 1 includes the semiconductor substrate 12 and a multilayer wiring layer 21 and a support substrate 22 formed on a front surface side (a lower side in the drawing) of the semiconductor substrate 12.

The semiconductor substrate 12 includes, for example, silicon (Si) and is formed to have a thickness of, for example, 1 to 6 μm. In the semiconductor substrate 12, for example, an N-type (second conductivity-type) semiconductor region 42 is formed for every pixel 2a in a P-type (first conductivity-type) semiconductor region 41, such that a photodiode PD is formed in pixel units. The P-type semiconductor regions 41 provided on front and back surfaces of the semiconductor substrate 12 also serve as hole charge accumulation regions for suppressing a dark current.

Note that at a pixel boundary of each pixel 2a between the N-type semiconductor regions 42, the P-type semiconductor region 41 is dug in a state where it penetrates through the semiconductor substrate 12, as illustrated in FIG. 2, in order to form an inter-pixel light shielding portion 47 as described later.

An interface (interface on a light receiving surface side) of the P-type semiconductor region 41 above the N-type semiconductor region 42 which is a charge accumulation region is configured to prevent reflection of incident light by a concave portion region 48 forming a fine concave-convex structure. The concave portion region 48 will be further described with reference to FIGS. 3 and 4.

The multilayer wiring layer 21 includes a plurality of wiring layers 43 and an interlayer insulating film 44. Furthermore, in the multilayer wiring layer 21, a plurality of pixel transistors Tr for performing readout and the like of charges accumulated in the photodiodes PD are also formed.

On a back surface side of the semiconductor substrate 12, a pinning layer 45 is formed so as to cover an upper surface of the P-type semiconductor region 41. The pinning layer 45 is formed using a high dielectric having a negative fixed charge so that a positive charge (hole) accumulation region is formed at an interface portion with the semiconductor substrate 12 to suppress generation of a dark current. By forming the pinning layer 45 so as to have the negative fixed charge, an electric field is applied to an interface with the semiconductor substrate 12 by the negative fixed charge, and the positive charge accumulation region is thus formed.

As the pinning layer 45, a Si cover film (SCF) can be used. Furthermore, the pinning layer 45 is formed using, for example, hafnium oxide ($HfO_2$). Furthermore, the pinning layer 45 may be formed using zirconium dioxide ($ZrO_2$), tantalum oxide ($Ta_2O_5$), or the like.

A transparent insulating film 46 is embedded in a penetration portion of the P-type semiconductor region 41, and is formed on the entire back surface side above the pinning layer 45 of the semiconductor substrate 12. The penetration portion of the P-type semiconductor region 41 in which the transparent insulating film 46 is embedded configures an inter-pixel light shielding portion 47 preventing leakage of incident light from adjacent pixels 2a.

The transparent insulating film 46 includes a material that transmits light, has an insulating property, and has a refractive index n1 smaller than a refractive index n2 of the semiconductor regions 41 and 42 (n1<n2). As the material of the transparent insulating film 46, silicon oxide ($SiO_2$), silicon nitride (SiN), silicon oxynitride (SiON), hafnium oxide ($HfO_2$), aluminum oxide ($Al_2O_3$), zirconium oxide ($ZrO_2$), tantalum oxide ($Ta_2O_5$), titanium oxide ($TiO_2$), lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), thulium oxide ($Tm_2O_3$), ytterbium oxide ($Yb_2O_3$), lutetium oxide ($Lu_2O_3$), yttrium oxide ($Y_2O_3$), a resin, or the like, can be used alone or in combination.

Note that an antireflection film may be stacked on the pinning layer 45 before forming the transparent insulating film 46. As a material of the antireflection film, silicon nitride (SiN), hafnium oxide ($HfO_2$), aluminum oxide ($Al_2O_3$), zirconium oxide ($ZrO_2$), tantalum oxide ($Ta_2Ta_5$), titanium oxide ($TiO_2$), lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), thulium oxide ($Tm_2O_3$), ytterbium oxide ($Yb_2O_3$), lutetium oxide ($Lu_2O_3$), yttrium oxide ($Y_2O_3$), or the like, can be used.

The antireflection film may be formed only on an upper surface of the concave portion region 48 or may be formed on both of the upper surface of the concave portion region 48 and a side surface of the inter-pixel light shielding portion 47, similar to the pinning layer 45.

A light shielding film 49 is formed in a region of the pixel boundary on the transparent insulating film 46. A material of the light shielding film 49 may be any material that shields light, and for example, tungsten (W), aluminum (Al), copper (Cu), or the like can be used as the material of the light shielding film 49.

A flattening film 50 is formed on the entire upper surface of the transparent insulating film 46 as well as the light shielding film 49. As a material of the flattening film 50, for example, an organic material such as a resin can be used.

On the flattening film 50, a color filter layer 51 of red, green, or blue is formed for every pixel. The color filter layer 51 is formed, for example, by spin-coating a photosensitive resin containing a coloring matter such as a pigment or a dye. Each color of red, green, and blue is arranged, for example, in a Bayer array, but may be arranged in another array manner. In the example of FIG. 2, a color filter layer 51 of blue (B) is formed in a right pixel 2a, and a color filter layer 51 of green (G) is formed in a left pixel 2a.

On the color filter layer 51, an on-chip lens 52 is formed for every pixel 2a. The on-chip lens 52 includes, for example, a resin-based material such as a styrene resin, an acrylic resin, a styrene-acryl copolymer resin, or a siloxane resin. The incident light is condensed by the on-chip lens 52, and the condensed light is efficiently incident on the photodiode PD via the color filter layer 51.

Each pixel 2a of the pixel array unit 3 of the solid-state imaging device 1 is configured as described above.

Here, the concave portion region 48 will be described with reference to FIG. 3. The concave portion region 48 is a region in which fine concave-convex portions are formed, and the concave portion and the convex portion are different from each other depending on where a surface which is a reference (hereinafter referred to as a reference surface) is located.

Furthermore, the concave portion region 48 is a region having a fine concave-convex structure formed at the interface (interface on the light receiving surface side) of the P-type semiconductor region 41 above the N-type semiconductor region 42 which is the charge accumulation region. This concave-convex structure is formed on a light receiving surface side of the semiconductor region 42, in other words, the semiconductor substrate 12. Therefore, a predetermined surface of the semiconductor substrate 12 can be used as the reference surface, and here, a description will be continued by taking a case where a part of the semiconductor substrate 12 is used as the reference surface as an example.

Figure 3:
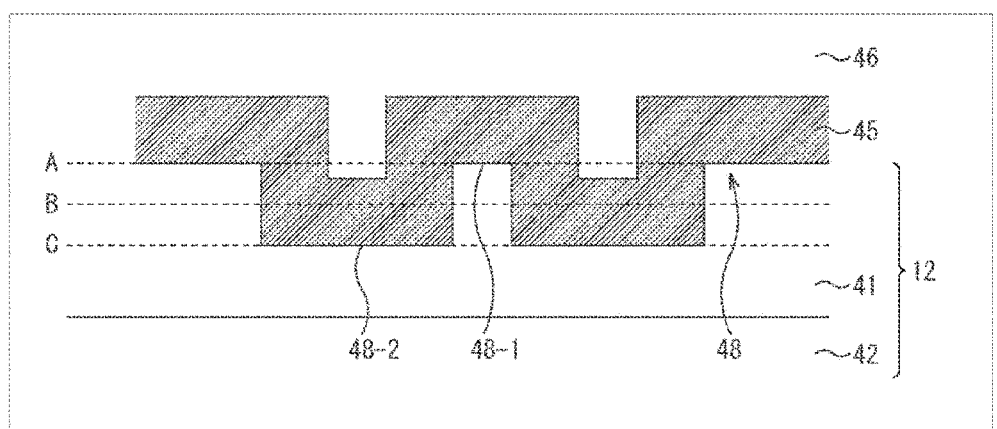
FIG. 3 is a diagram for describing a concave portion region.

FIG. 3 is an enlarged view of the vicinity of the concave portion region 48. A surface of the concave portion region 48 which is a boundary portion between the concave portion region 48 and the pinning layer 45 and is close to the transparent insulating film 46 is referred to as an upper surface 48-1. Furthermore, a surface of the concave portion region 48 which is a boundary portion between the concave portion region 48 and the pinning layer 45 and is close to the semiconductor region 42 is referred to as a lower surface 48-2.

Furthermore, it is assumed that a reference surface A is a surface at a position where the upper surface 48-1 is formed, and it is assumed that a reference surface C is a surface at a position where the lower surface 48-2 is formed. It is assumed that a reference surface B is a surface that is at a position between the reference surface A and the reference surface C, in other words, a surface that is at a position between the upper surface 48-1 and the lower surface 48-2.

In a case where the reference surface A is used as a reference, a shape of the concave portion region 48 is a shape in which concave portions are present with respect to the reference surface A. That is, in a case where the reference surface A is used as the reference, the lower surface 48-2 is located at a position depressed downward with respect to the reference surface A (=the upper surface 48-1), such that the concave portion region 48 becomes a region in which fine concave portions are formed. Moreover, in other words, when the reference surface A is used as the reference, the concave portion region 48 can be said to be a region in which the concave portion is formed between the upper surface 48-1 and the upper surface 48-1, such that fine concave portions are formed.

In a case where the reference surface C is used as a reference, a shape of the concave portion region 48 is a shape in which convex portions are present with respect to the reference surface C. That is, in a case where the reference surface C is used as the reference, the upper surface 48-1 is located at a position projecting upward with respect to the reference surface C (=the lower surface 48-2), such that the concave portion region 48 becomes a region in which fine convex portions are formed. Moreover, in other words, when the reference surface C is used as the reference, the concave portion region 48 can be said to be a region in which the convex portion is formed between the lower surface 48-2 and the lower surface 48-2, such that fine convex portions are formed.

In a case where the reference surface B is used as a reference, a shape of the concave portion region 48 is a shape in which concave portions and convex portions are present with respect to the reference surface B. That is, in a case where the reference surface B is used as the reference, the lower surface 48-2 is located at a position depressed downward with respect to the reference surface B (=the surface that is at the position between the upper surface 48-1 and the lower surface 48-2), such that the concave portion region 48 can be said to be a region in which fine concave portions are formed.

Furthermore, in a case where the reference surface B is used as the reference, the upper surface 48-1 is located at a position projecting upward with respect to the reference surface B, such that the concave portion region 48 can be said to be a region in which fine convex portions are formed.

As described above, the concave portion region 48 is a region that can be expressed as a region formed by the fine concave portions, a region formed by the fine convex portions, or a region formed by the fine concave portions and convex portions, depending on where the reference surface is set, in cross-sectional view of the pixel 1.

In the following description, the concave portion region 48 will be described by taking a case where the reference surface A, that is, the upper surface 48-1 is used as the reference surface as an example, and a description will be continued on the assumption that the concave portion region 48 is a region in which the fine concave portions are formed.

In the concave portion region 48, a pitch between the concave portions corresponding to a period of the concave portions is set to, for example, 250 nm or more.

Figure 4:
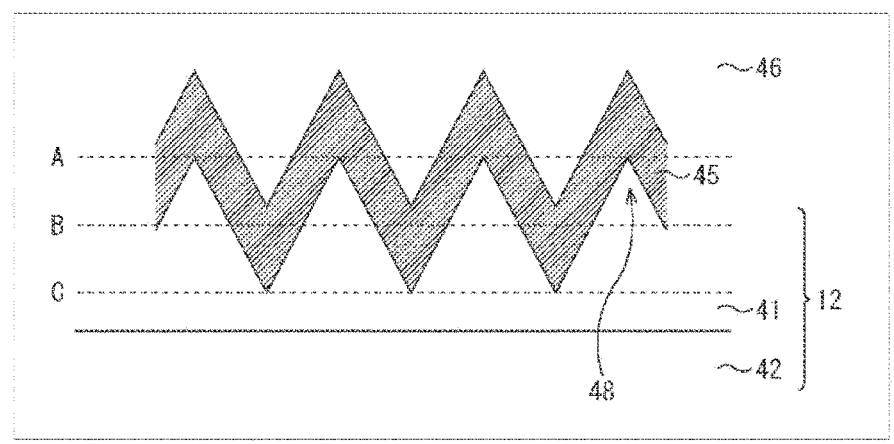
FIG. 4 is a diagram for describing a concave portion region.

In an example illustrated in FIG. 3, a case where the concave portion region 48 has a shape in which planes of the upper surface 48-1 and the lower surface 48-2 are combined with each other has been illustrated as an example, but a concave portion region 48 having a shape as illustrated in FIG. 4 is also included in the concave portion region 48 to which the present technology is applied.

The concave portion region 48 illustrated in FIG. 4 is formed in a triangular shape in cross-sectional view. Even though a shape of the concave portion region 48 is such a shape, a reference surface can be set, and concave portions or convex portions can be defined on the basis of the reference surface.

Since the concave portion region 48 illustrated in FIG. 4 is formed in the triangular shape in cross-sectional view, as an example of the reference surface, a surface connecting vertices to each other is set to be the reference surface.

In cross-sectional view, a surface including a line connecting vertices close to the transparent insulating film 46 among the vertices of the triangular shape of the concave portion region 48 to each other is defined as a reference surface A. A surface including a line connecting vertices close to a bottom side, in other words, vertices close to the semiconductor region 42, among the vertices of the triangular shape of the concave portion region 48 to each other is defined as a reference surface C. A surface between the reference surface A and the reference surface C is defined as a reference surface B.

Even in a case where the reference surface is set at a position of the vertex of the triangular shape of the concave portion region 48 as described above, a shape of the concave portion region 48 can be expressed differently depending on where the reference surface is located, similar to a case described with reference to FIG. 3.

That is, in a case where the reference surface A is used as a reference, a shape of the concave portion region 48 is a shape in which downward triangular (valley-shaped) concave portions are present with respect to the reference surface A. That is, in a case where the reference surface A is used as the reference, a valley region is located below the reference surface A and corresponds to the concave portion. Therefore, the concave portion region 48 becomes a region in which fine concave portions are formed. Moreover, in other words, when the reference surface A is used as the reference, the concave portion region 48 can be said to be a region in which the concave portion is formed between a vertex of a triangle and a vertex of an adjacent triangle, such that fine concave portions are formed.

In a case where the reference surface C is used as a reference, a shape of the concave portion region 48 is a shape in which upward triangular (peak-shaped) convex portions are present with respect to the reference surface C. That is, in a case where the reference surface C is used as the reference, a peak region is located above the reference surface C and corresponds to the convex portion. Therefore, the concave portion region 48 becomes a region in which fine convex portions are formed. Moreover, in other words, when the reference surface C is used as the reference, the concave portion region 48 can be said to be a region in which the convex portion is formed between vertices of a bottom side of the triangular shape, such that fine head portions are formed.

In a case where the reference surface B is used as a reference, a shape of the concave portion region 48 is a shape in which concave portions and convex portions (valleys and peaks) are present with respect to the reference surface B. That is, in a case where the reference surface B is used as the reference, the concave portions that become the valleys are present below the reference surface B and the convex portions that become the peaks are present above the reference surface B. Therefore, the concave portion region 48 can be said to be a region including fine concave portions and convex portions.

As described above, even though a shape of the concave portion region 48 is a zigzag shape in which the peaks and the valleys are present as illustrated in FIG. 4, the concave portion region 48 can be defined to be a region that can be expressed as a region formed by the fine concave portions, a region formed by the fine convex portions, or a region formed by the fine concave portions and convex portions, depending on where the reference surface is set, in cross-sectional view of the pixel 1.

Furthermore, in the concave portion region 48 illustrated in FIG. 3 or FIG. 4, for example, in a case where the reference surface is an interface between the flattening film 50 and the transparent insulating film 46, the concave portion region 48 has a shape in which regions (valleys) having a depression are present, and can thus be said to be a region formed by the fine concave portions.

Furthermore, in a case where the reference surface is an interface between the P-type semiconductor region 41 and the N-type semiconductor region 42, the concave portion region 48 has a shape in which projecting regions (peaks) are present, and can thus be said to be a region formed by the fine convex portions.

As described above, in cross-sectional view of the pixel 2, a predetermined flat surface is used as the reference surface, and a shape of the concave portion region 48 can also be expressed depending on whether portions having a valley shape with respect to the reference surface are formed or portions having a peak shape with respect to the reference surface are formed.

Moreover, as will be described later with reference to FIG. 11, a configuration in which a flat portion 53 is formed between the pixels 2 can also be adopted. The flat portion 53 is a region provided by providing a region of a predetermined width in which the concave portion region 48 is not formed between the pixels 2e at an interface on the light receiving surface side of the semiconductor substrate 12. A surface including the flat portion 53 may be used as the reference surface.

Figure 11:
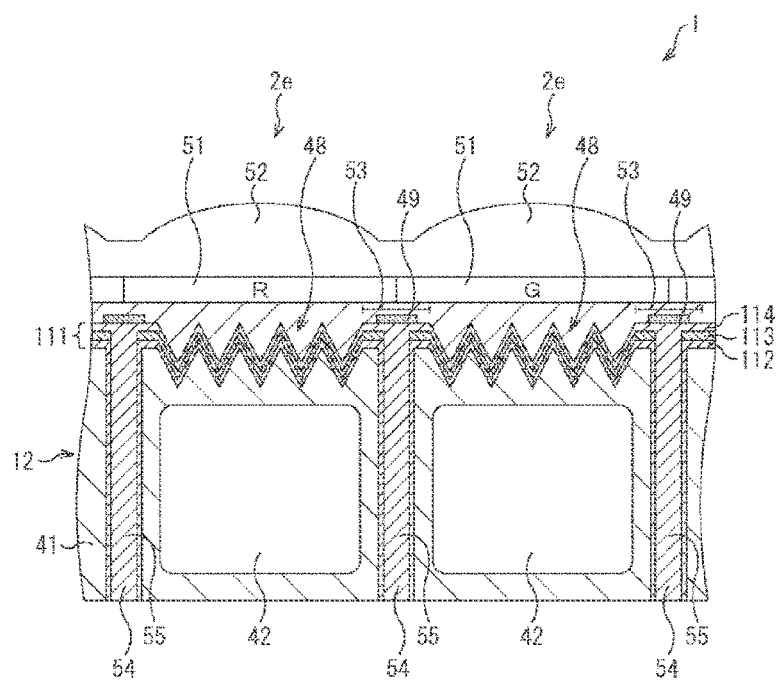
FIG. 11 is a diagram illustrating a cross-sectional configuration example of a pixel according to a fifth embodiment.

Referring to FIG. 11, in case where the surface including the flat portion 53 is used as the reference surface, the concave portion region 48 can be said to have a shape having portions depressed downward with respect to the reference surface, in other words, valley-shaped portions, and can thus be said to be a region in which fine concave portions are formed.

As described above, the concave portion region 48 is a region that can be expressed as a region formed by the fine concave portions, a region formed by the fine convex portions, or a region formed by the fine concave portions and convex portions, depending on where the reference surface is set, in cross-sectional view of the pixel 1.

Moreover, the concave portion region 48 can be expressed as forming the region formed by the fine concave portions, forming the region formed by the fine convex portions, or forming the region formed by the fine concave portions, depending on a method of forming the concave portion region 48.

For example, in a case where the concave portion region 48 illustrated in FIG. 3 is formed, that is, in a case where the concave portion region 48 having a shape in which the upper surface 48-1 is formed to be larger than the lower surface 48-2 is formed, it can be said that a portion that becomes the concave portion is formed and it can be said that a portion that becomes the convex portion is left, by shaving the substrate (semiconductor substrate 12).

In a case where a shaving amount of the substrate exceeds 50%, an area of the concave portion is formed to be larger than that of the convex portion, such that an amount of the shaved substrate (silicon) becomes a state where it is larger than that of the remaining substrate. In other words, a case of such a method of forming the concave portion region is formation in a situation where the concave portion is dominant, and it can be expressed that the concave portion region 48 is formed by providing a plurality of convex portions.

Furthermore, in a case where a shaving amount of the substrate is 50% or less, an area of the concave portion is formed to be smaller than that of the convex portion, such that an amount of the shaved substrate (silicon) becomes a state where it is smaller than that of the remaining substrate. In other words, a case of such a method of forming the concave portion region is formation in a situation where the convex portion is dominant, and it can be expressed that the concave portion region 48 is formed by providing a plurality of concave portions.

Consequently, according to the method of forming the concave portion region 48, in a case where the concave portion becomes dominant, it can be expressed that the plurality of convex portions is provided and in a case where the substrate becomes dominant, it can be expressed that the plurality of concave portions is provided.

As described above, depending on the method of forming a concave portion region 48, the concave portion region 48 is a region that can be expressed as a region formed by the fine concave portions, a region formed by the fine convex portions, or a region formed by the fine concave portions and convex portions, in cross-sectional view of the pixel 1.

In the following description, a description will be continued on the assumption that the concave portion region 48 is the region formed by the fine concave portions, but the concave portion region 48 is an expression including a region such as the region formed by the fine convex portions or the region formed by the fine concave portions and convex portions, as described above.

<Pixel Structure According to Second Embodiment>

Figure 5:
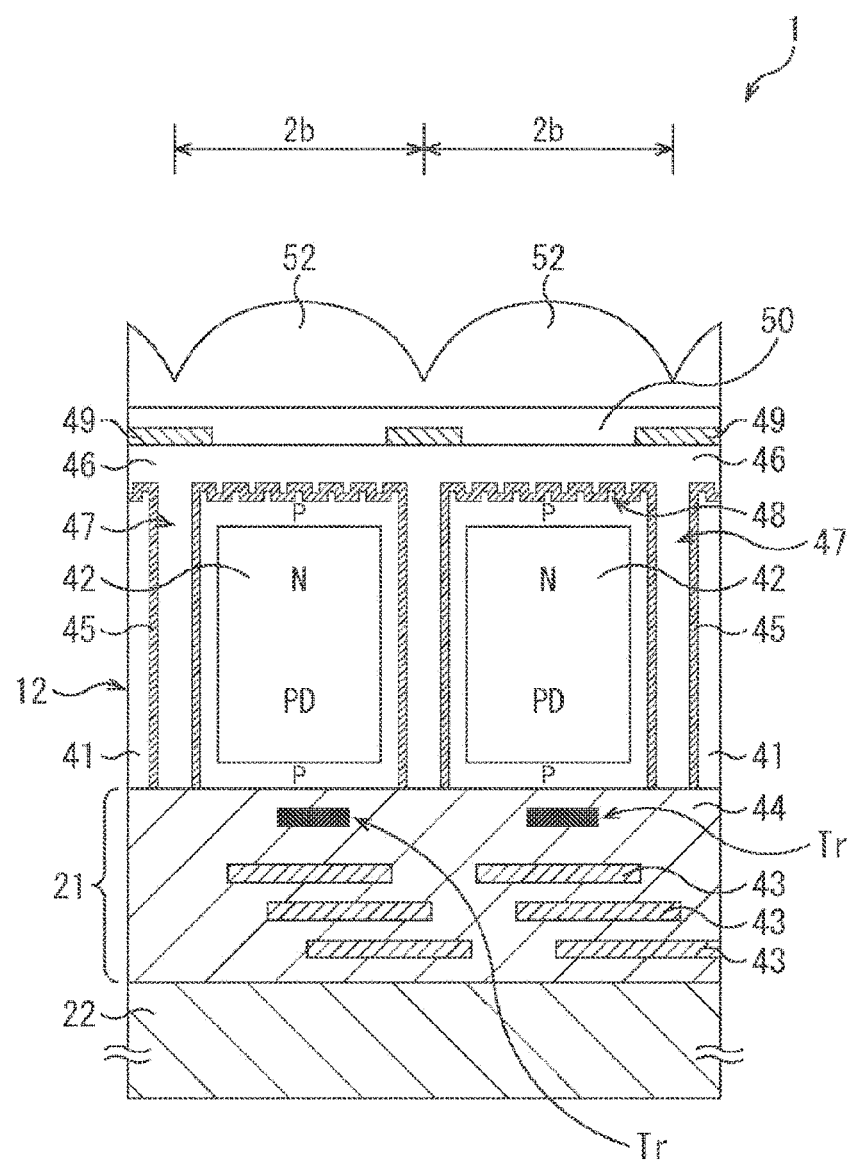
FIG. 5 is a diagram illustrating a cross-sectional configuration example of a pixel according to a second embodiment.

FIG. 5 is a diagram illustrating a cross-sectional configuration example of a pixel 2b according to a second embodiment.

The cross-sectional configuration example of the pixel 2b illustrated in FIG. 5 has a configuration in which the color filter layer 51 is removed from the configuration of the pixel 2a according to the first embodiment illustrated in FIG. 2. The present technology can also be applied to the pixel 2b having a structure in which the color filter layer 51 is not present.

The pixel 2b according to the second embodiment can be applied to, for example, a pixel receiving infrared light (IR). As described later, according to the pixel 2b to which the present technology is applied, an optical path length can be increased, and it becomes thus possible to improve sensitivity without increasing a thickness of the pixel 2b, in other words, a thickness of a semiconductor substrate 12, even in the infrared light having a long wavelength.

<Effect of Pixel Structures According to First and Second Embodiments>

Figure 6B:
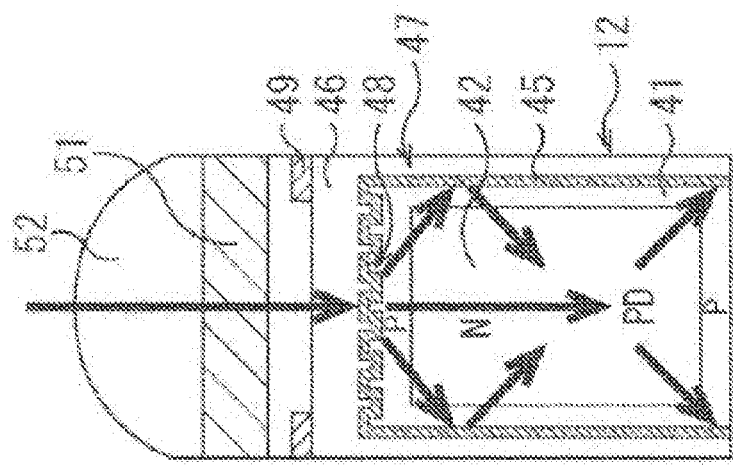
FIGS. 6A and 6B are diagrams for describing an effect of a pixel structure of the present disclosure.
Figure 6A:
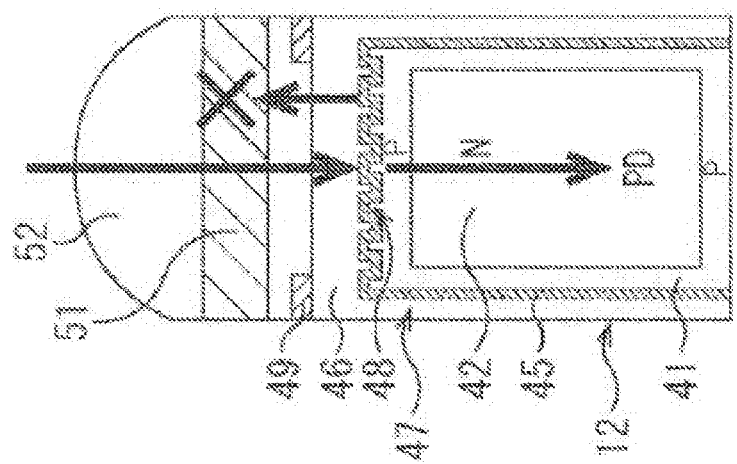

FIGS. 6A and 6B are diagrams for describing an effect of a pixel structure of the pixel 2a illustrated in FIG. 2. Since a similar effect can also be obtained in the pixel 2b illustrated in FIG. 5, here, a description will be continued by taking the pixel structure of the pixel 2a illustrated in FIG. 2 as an example. Furthermore, an effect described here is an effect similarly obtained in an embodiment as described later.

FIG. 6A is a diagram for describing an effect by the concave portion region 48.

Reflection of incident light is prevented by the concave portion region 48. Therefore, sensitivity of the solid-state imaging device 1 can be improved.

FIG. 6B is a diagram for describing an effect by an inter-pixel light shielding portion 47 having a trench structure.

Conventionally, in a case where the inter-pixel light shielding portion 47 is not provided, incident light scattered by the concave portion region 48 might pass through a photoelectric conversion region (semiconductor regions 41 and 42). The inter-pixel light shielding portion 47 has an effect of reflecting the incident light scattered by the concave portion region 48 to confine the incident light in the photoelectric conversion region. Therefore, an optical distance for absorbing silicon is extended, and sensitivity can thus be improved.

Furthermore, since the inter-pixel light shielding portion 47 is dug in a state where it penetrates through the semiconductor substrate 12, in other words, in a state where it reaches the multilayer wiring layer 21, the inter-pixel light shielding portion 47 has an effect of more certainly confining the incident light in the photoelectric conversion region. Moreover, although there is also incident light reflected by the multilayer wiring layer 21, the incident light reflected by the multilayer wiring layer 21 can also be confined in the photoelectric conversion region, such that the sensitivity can be further improved.

Assuming that a refractive index (n1) of the inter-pixel light shielding portion 47 is 1.5 (corresponding to $SiO_2$) and a refractive index (n2) of the semiconductor region 41 in which the photoelectric conversion region is formed is 4.0, a waveguide effect (photoelectric conversion region: core, inter-pixel light shielding portion 47: clad) occurs due to the a difference (n1<n2) between the refractive indices, and the incident light is thus confined in the photoelectric conversion region. The concave portion region 48 has a disadvantage of deteriorating color mixing due to light scattering, but can counteract the deterioration of the color mixing by combining with the inter-pixel light shielding portion 47, and further has an advantage of improving photoelectric conversion efficiency by increasing an incident angle of the incident light traveling in the photoelectric conversion region.

Furthermore, since it becomes possible to extend the optical distance for absorbing silicon, a structure of increasing the optical path length can be obtained as described above. Therefore, it becomes possible to efficiently condense even incident light having a long wavelength on the photodiode PD, such that it becomes possible to improve sensitivity even for the incident light having the long wavelength.

<Optimal Condition Example of Pixel Structure>

Optimal conditions at various places of the pixel 2a will be described with reference to FIG. 7.

In the embodiment described above, the concave portion region 48 has been formed in the entire region on the light receiving surface side of the semiconductor regions 41 and 42 in which the photodiode PD is formed.

Figure 7:
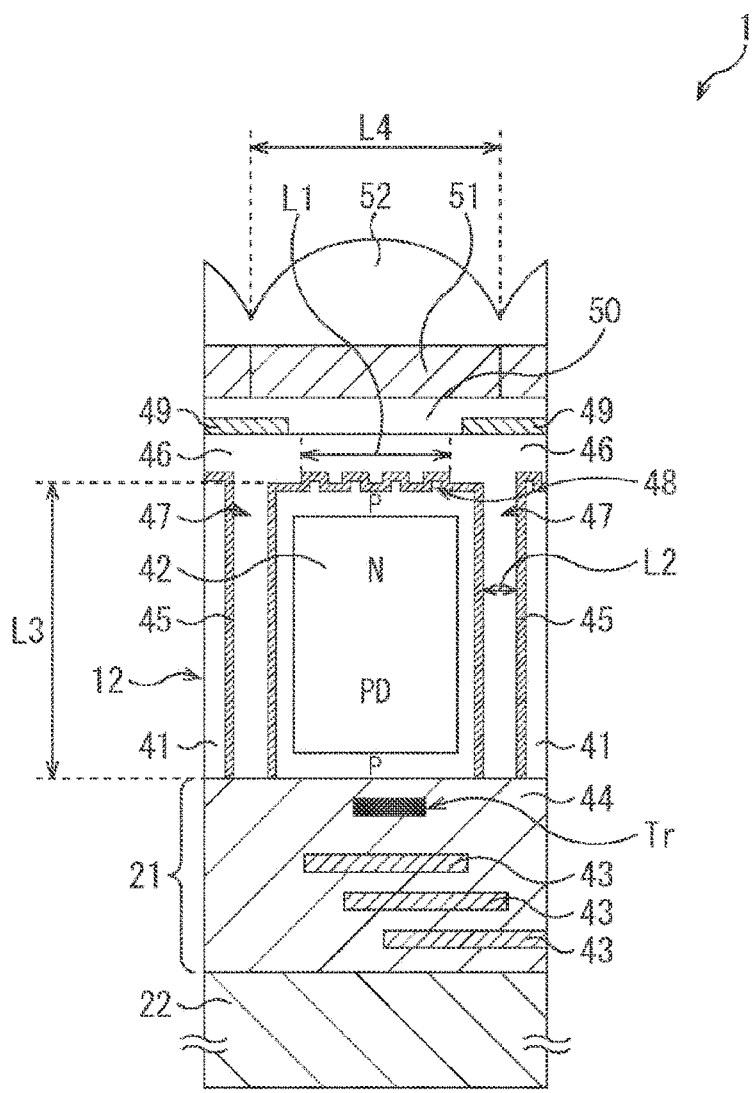
FIG. 7 is a diagram for describing optimal conditions at various places of a pixel.

However, a concave portion arrangement region L1 (concave portion arrangement width L1) of the concave portion region 48 can be formed only at a pixel central portion in a region of a predetermined ratio to a pixel region L4 (pixel width L4), as illustrated in FIG. 7. Then, it is desirable that the concave portion arrangement region L1 of the concave portion region 48 is a region of approximately 80% of the pixel region L4.

The light condensed by the on-chip lens 52 is focused on the center of a region of a sensor (photodiode PD), which is the photoelectric conversion region. Therefore, the closer to the center of the sensor, the stronger the light intensity, and the more distant from the center of the sensor, the weaker the light intensity In a region distant from the center of the sensor, there are many diffracted light noise components, that is, color mixture noise components to adjacent pixels.

Therefore, a concave portion structure is not formed in the vicinity of the inter-pixel light shielding portion 47, such that light scattering can be suppressed and noise can be suppressed. The concave portion arrangement region L1 of the concave portion region 48 is changed depending on a difference in an upper layer structure such as a pixel size, a curvature of the on-chip lens, and a total thickness of the pixel 2a, but it is desirable that the on-chip lens 52 is generally a region of approximately 80% of the pixel region L4 in order to condense spot light on a region of 80% of the center of the region of the sensor.

Furthermore, a size (convex portion formed between the concave portions) of the concave portion of the concave portion region 48 can be formed to be different for every color. As a size of the convex portion (a size from the bottom side to the vertex of the concave portion), a height, an arrangement area (an area in which the convex portion is formed in plan view), and a pitch can be defined.

Here, a description will be provided using the convex portion on the assumption that a depth of the concave portion is equal to the height of the convex portion and the convex portion is a portion of the upper surface 48-1 based on the reference surface C as described with reference to FIG. 3.

The height of the convex portion becomes lower as a wavelength of the incident light becomes shorter. That is, assuming that a height of a convex portion of a red pixel 2a is hR, a height of a convex portion of a green pixel 2a is hG, and a height of a convex portion of a blue pixel 2a is hB, the concave portion regions 48 can be formed so that a magnitude relation of $$hR > hG > hB$$

is established.

Furthermore, the arrangement area of the convex portion becomes smaller as the wavelength of the incident light becomes shorter. That is, assuming that an arrangement area of the convex portion of the red pixel 2a is xR, an arrangement area of the convex portion of the green pixel 2a is xG, and an arrangement area of the convex portion of the blue pixel 2a is xB, the concave portion regions 48 can be formed so that a magnitude relation of xR>xG>xB is established. A width of the arrangement area in one direction corresponds to the concave portion arrangement width L1 in FIG. 7.

The pitch between the convex portions becomes lower as the wavelength of the incident light becomes shorter. That is, assuming that a pitch between the convex portions of the red pixel 2a is pR, a pitch between the convex portions of the green pixel 2a is pG, and a pitch between the convex portion of the blue pixel 2a is pB, the concave portion regions 48 can be formed so that a magnitude relation of $$pR > pG > pB$$

is established.

Furthermore, the pitch between the convex portions can be set to be a divisor of a pixel pitch between two-dimensionally arranged pixels, in other words, a pitch between the pixels 2 of the pixel array unit 3 (see FIG. 1).

The concave portion region 48 satisfying such conditions can be formed by, for example, wet etching using a resist pattern as a mask.

Next, a groove width L2 of the inter-pixel light shielding portion 47 necessary for preventing leakage of the incident light into the adjacent pixels and totally reflecting the incident light will be described.

It is sufficient if the groove width L2 of the inter-pixel light shielding portion 47 may be 40 nm or more, assuming that a wavelength (λ) of the incident light is 600 nm, the refractive index (n2) of the semiconductor region 41 is 4.0, the refractive index (n1) of the inter-pixel light shielding portion 47 is 1.5 (corresponding to SiO₂), and an incident angle (θ) from the semiconductor region 41 to the inter-pixel light shielding portion 47 is 60°. However, it is desirable that the groove width L2 of the inter-pixel light shielding portion 47 is 200 nm or more from the viewpoint of a margin satisfying optical characteristics and a process embedding property.

A digging amount L3 of the inter-pixel light shielding portion 47 will be described.

The larger the digging amount L3 of the inter-pixel light shielding portion 47, the larger the effect of suppressing color mixing. Therefore, the digging amount L3 can be set to a size equal to the thickness of the semiconductor substrate 12. That is, the inter-pixel light shielding portion 47 is formed in a state where it penetrates through the semiconductor substrate 12. In this case, the digging amount L3 is the same as the thickness of the semiconductor substrate 12.

As illustrated in FIG. 7, a case where the inter-pixel light shielding portion 47 has a dug shape without a taper is exemplified, but the inter-pixel light shielding portion 47 may have a tapered shape.

The inter-pixel light shielding portion 47 has a tapered shape differing depending on whether or not the inter-pixel light shielding portion 47 is dug from the front surface side of the semiconductor substrate 12 configuring the pixel 2a, that is, a side close to the multilayer wiring layer 21, which is a lower side in FIG. 7, or is dug from the back surface side of the semiconductor substrate 12, that is, an incident surface side, which is an upper side in FIG. 7, at the time of manufacturing the inter-pixel light shielding portion 47.

The inter-pixel light shielding portion 47 has a tapered shape in which a side where the digging is started is wide and a side where the digging is ended is narrow. Therefore, in a case where the semiconductor substrate 12 is dug from a front surface side of the pixel 2a, the inter-pixel light shielding portion 47 has a tapered shape in which a side of the semiconductor substrate 12 close to the multilayer wiring layer 21 is wide and a side of the semiconductor substrate 12 close to the transparent insulating film 46 is narrow. Furthermore, in a case where the semiconductor substrate 12 is dug from a back surface side of the pixel 2a, the inter-pixel light shielding portion 47 has a tapered shape in which a side of the semiconductor substrate 12 close to the transparent insulating film 46 is wide and a side of the semiconductor substrate 12 close to the multilayer wiring layer 21 is narrow.

In a case where the inter-pixel light shielding portion 47 has the tapered shape, for example, assuming that the refractive index (n1) of the inter-pixel light shielding portion 47 is 1.5 (corresponding to SiO₂) and the refractive index (n2) of the P-type semiconductor region 41 is 4.0, an interface reflectance is very high, and a shape of the inter-pixel light shielding portion 47 can thus be a forward tapered or reverse tapered shape within a range of 0° to 30°.

<Pixel Structure According to Third Embodiment>

Figure 8:
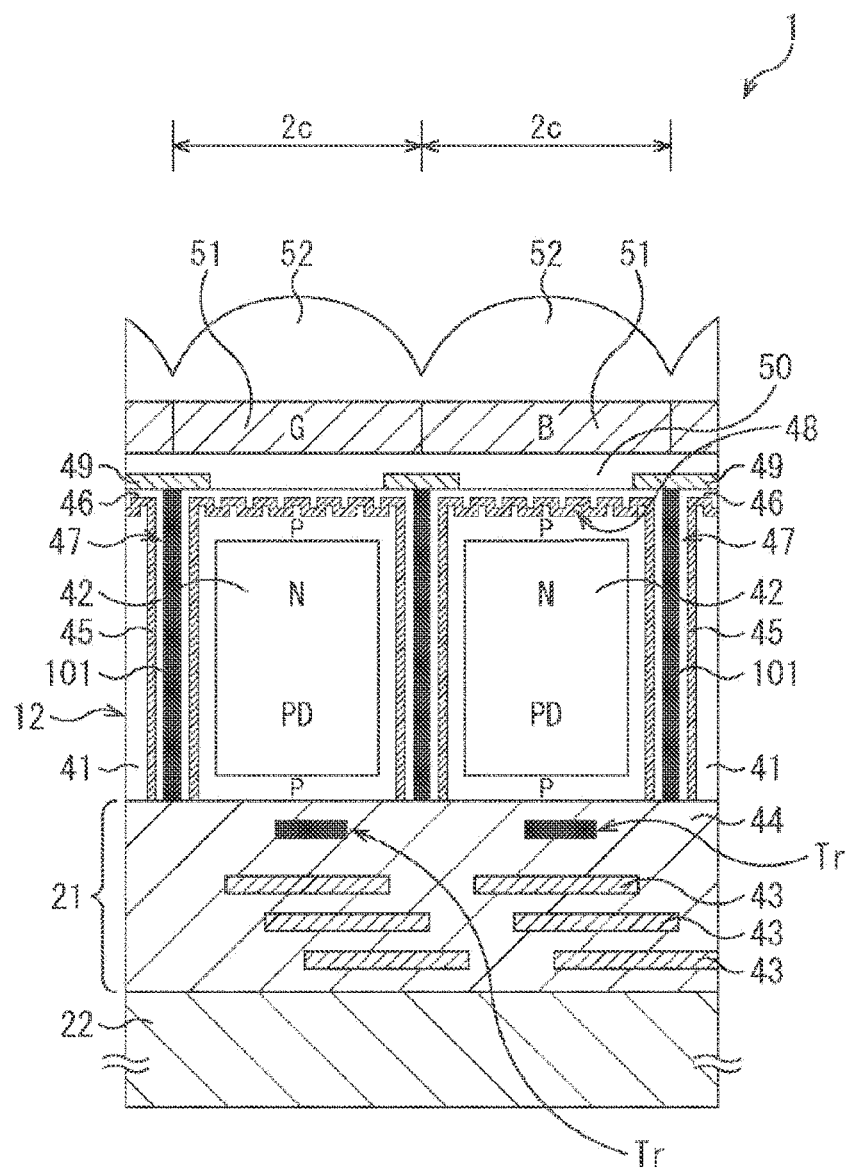
FIG. 8 is a diagram illustrating a cross-sectional configuration example of a pixel according to a third embodiment.

FIG. 8 is a diagram illustrating a cross-sectional configuration example of a pixel 2c according to a third embodiment.

In FIG. 8, portions corresponding to those of the first embodiment illustrated in FIG. 2 will be denoted by the same reference numerals, and a description thereof will be appropriately omitted.

The third embodiment illustrated in FIG. 8 is different from the first embodiment described above in that a metal light shielding portion 101 is newly provided with filling a central portion of an inter-pixel light shielding portion 47 having a trench structure arranged between the pixels 2c with, for example, a metal material such as tungsten (W) or aluminum (Al).

Furthermore, in the third embodiment, a transparent insulating film 46 stacked on a front surface of a pinning layer 45 is formed conformally using, for example, a sputtering method and the like.

In a solid-state imaging device 1 according to the third embodiment, color mixing can be further suppressed by further providing the metal light shielding portion 101. Furthermore, by providing the metal light shielding portion 101, it becomes possible to reflect incident light in a photoelectric conversion region and condense the incident light by semiconductor regions 41 and 42 in which a photodiode PD is formed, and it is thus possible to improve sensitivity.

<Pixel Structure According to Fourth Embodiment>

Figure 9:
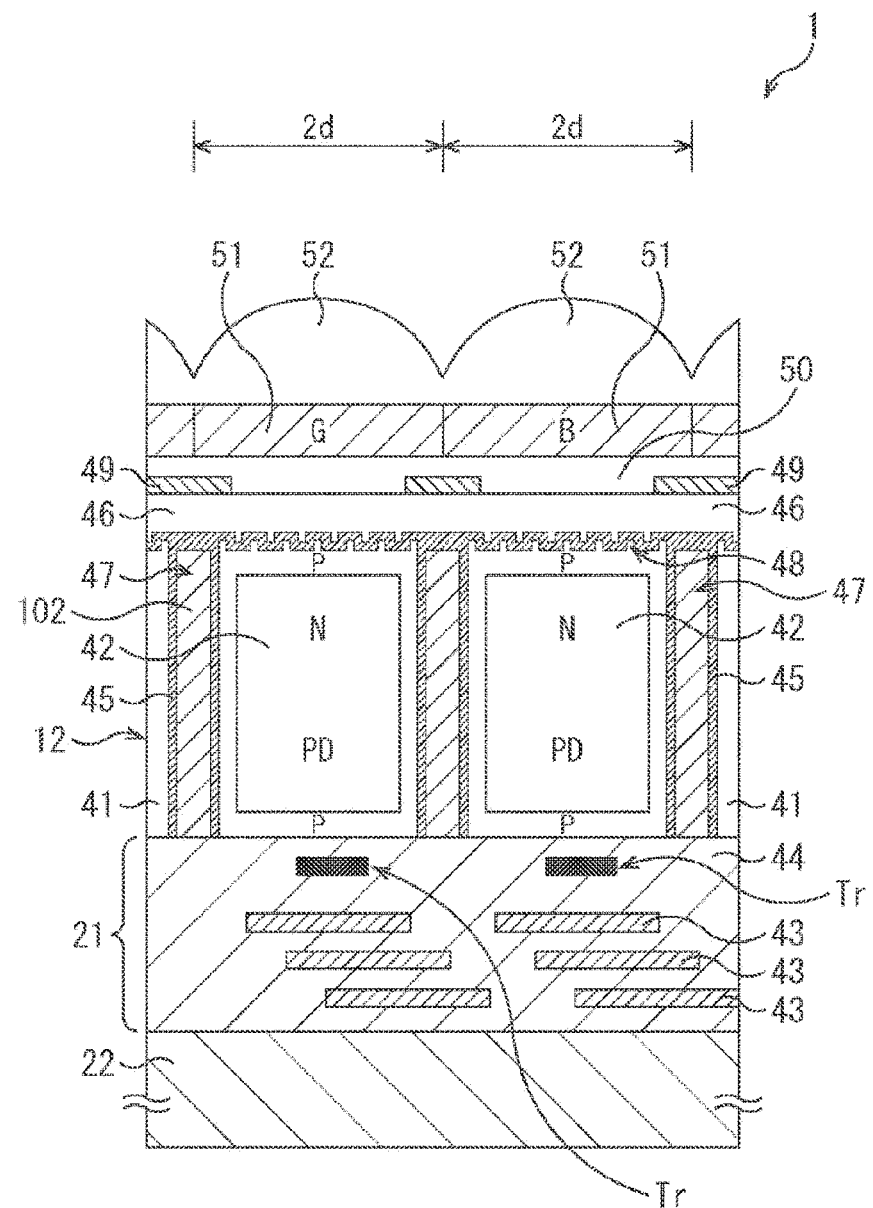
FIG. 9 is a diagram illustrating a cross-sectional configuration example of a pixel according to a fourth embodiment.

FIG. 9 is a diagram illustrating a cross-sectional configuration example of a pixel 2d according to a fourth embodiment.

The pixel 2d according to the fourth embodiment has a configuration similar to that of the pixel 2a according to the first embodiment except that a material filled in an inter-pixel light shielding portion 47 is a polysilicon (Poly Si) layer 102. That is, the inter-pixel light shielding portion 47 of the pixel 2d includes a pinning layer 45 and the polysilicon layer 102.

Figure 10:
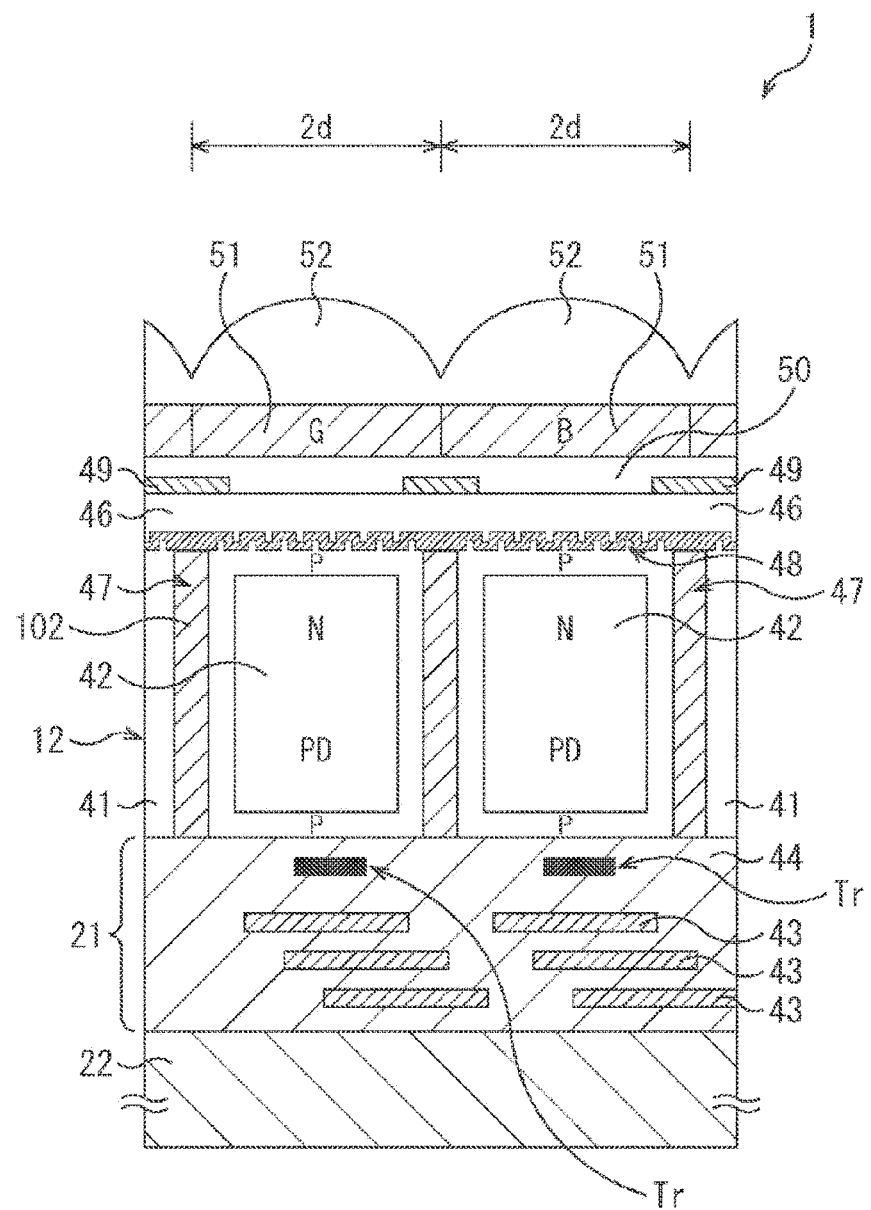
FIG. 10 is a diagram illustrating another cross-sectional configuration example of a pixel according to the fourth embodiment.

Furthermore, as illustrated in the pixel 2d illustrated in FIG. 10, only the polysilicon layer 102 may be formed in the inter-pixel light shielding portion 47 without forming the pinning layer 45 in the inter-pixel light shielding portion 47.

As described above, the inter-pixel light shielding portion 47 may be formed by filling polycrystalline silicon such as the polysilicon 102 in the inter-pixel light shielding portion 47. Furthermore, a material having a lower refractive index than that of silicon configuring a semiconductor substrate 12 may be further added as an insulating film in the inter-pixel light shielding portion 47.

<Pixel Structure According to Fifth Embodiment>

Other embodiments of pixel structures will be described with reference to FIGS. 11 to 19. In FIGS. 11 to 19, a description will be provided using pixel structures illustrated in a simplified manner as compared with the cross-sectional configuration example as illustrated in FIG. 2, and the respective corresponding components may be denoted by different reference numbers.

Furthermore, in other embodiments of pixel structures described below, a description will be continued by taking a case where a pixel includes a color filter layer 51 as in the pixel 2a according to the first embodiment as an example, but the present technology can also be applied to a pixel that does not include the color filter layer 51 as in the pixel 2b according to the second embodiment.

FIG. 11 is a diagram illustrating a cross-sectional configuration example of a pixel 2e according to a fifth embodiment.

Although there are portions that overlap the description described above, a configuration of a solid-state imaging device 1 will be described again with reference to FIG. 11 As illustrated in FIG. 11, the solid-state imaging device 1 is configured by stacking an antireflection film 111, a transparent insulating film 46, a color filter layer 51, and an on-chip lens 52 on a semiconductor substrate 12 in which an N-type semiconductor region 42 configuring a photodiode PD is formed for every pixel 2a.

The antireflection film 111 has a stacked structure in which, for example, a fixed charge film and an oxide film are stacked, and for example, an insulating thin film having a high dielectric constant (high-k) by an atomic layer deposition (ALD) method can be used as the antireflection film 111. Specifically, hafnium oxide ($HfO_2$), aluminum oxide ($Al_2O_3$), titanium oxide ($TiO_2$), strontium titanium oxide (STO), or the like, can be used. In the example of FIG. 11, the antireflection film 111 is configured by stacking a hafnium oxide film 112, an aluminum oxide film 113, and a silicon oxide film 114.

Moreover, a light shielding film 49 is formed between the pixels 2e so as to be stacked on the antireflection film 111. A single-layer metal film such as titanium (Ti), titanium nitride (TiN), tungsten (W), aluminum (Al), or tungsten nitride (WN), is used as the light shielding film 49. Alternatively, a stacked film of these metals (for example, a stacked film of titanium and tungsten, a stacked film of titanium nitride and tungsten, or the like) may be used as the light shielding film 49.

In the solid-state imaging device 1 configured as described above, in the pixel 2e according to the fifth embodiment, a flat portion 53 is provided by providing a region of a predetermined width in which a concave portion region 48 is not formed between the pixels 2e at a light receiving surface side interface of the semiconductor substrate 12. As described above, the concave portion region 48 is provided by forming a fine concave structure, and the flat portion 53 is provided by making a flat surface remain without forming the fine concave structure in a region between the pixels 2e. As described above, by adopting a pixel structure in which the flat portion 53 is provided, it is possible to suppress generation of diffracted light in a region (pixel separation region) of a predetermined width, which is the vicinity of another adjacent pixel 2e, to prevent generation of color mixing.

That is, it has been known that in a case where the concave portion region 48 is formed in the semiconductor substrate 12, diffraction of vertical incident light occurs, and for example, as an interval (pitch) between concave portions increases, a component of diffracted light increases, such that a ratio of light incident on another adjacent pixel 2 increases.

On the other hand, in the solid-state imaging device 1, by providing the flat portion 53 in the region of the predetermined width between the pixels 2e in which it is easy for the diffracted light to leak to another adjacent pixel 2e, the diffraction of the vertical incident light is not generated in the flat portion 53, such that it is possible to prevent the generation of the color mixing.

In the pixel 2e illustrated in FIG. 11, a pixel separating portion 54 separating the pixels 2e from each other is formed in the semiconductor substrate 12. The pixel separating portion 54 is formed in a portion corresponding to the inter-pixel light shielding portion 47 in the first to fourth embodiments described above.

The pixel separating portion 54 is formed by forming a trench penetrating through the semiconductor substrate 12 between the N-type semiconductor regions 42 configuring the photodiodes PD, forming an aluminum oxide film 113 on an inner surface of the trench, and further embedding an insulator 55 into the trench at the time of forming the silicon oxide film 114.

Note that as in the pixel d (see FIG. 9 or FIG. 10) according to the fourth embodiment, a configuration in which a portion of the silicon oxide film 114 that is filled in the pixel separating portion 54 includes a polysilicon layer 102 can be applied.

By configuring such a pixel separating portion 54, adjacent pixels 2e are electrically completely separated from each other by the insulator 55 embedded in the trench. Therefore, it is possible to prevent charges generated inside the semiconductor substrate 12 from leaking to the adjacent pixel 2e.

<Pixel Structure According to Sixth Embodiment>

Figure 12:
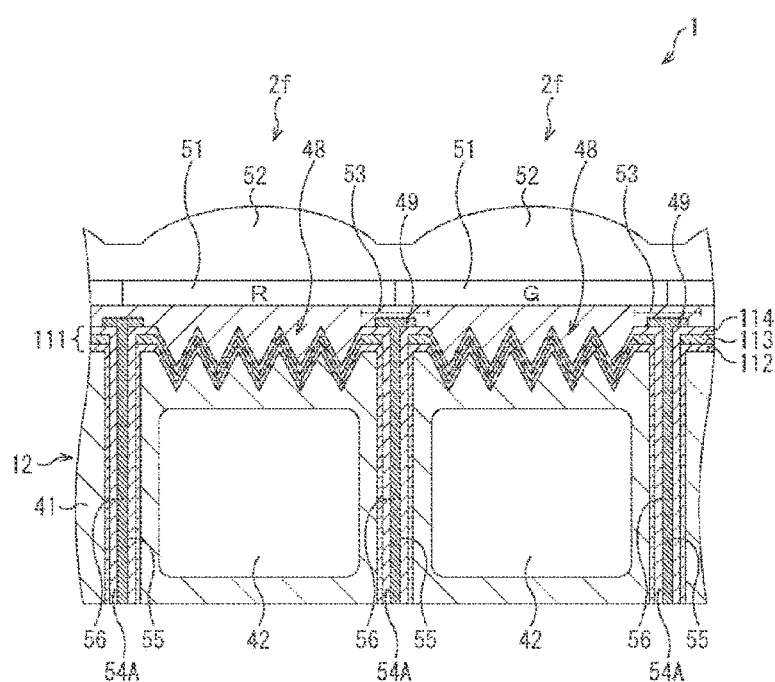
FIG. 12 is a diagram illustrating a cross-sectional configuration example of a pixel according to a sixth embodiment.

FIG. 12 is a diagram illustrating a cross-sectional configuration example of a pixel 2f according to a sixth embodiment.

In FIG. 12, a basic configuration of a solid-state imaging device 1 is common to the configuration illustrated in FIG. 11. In the pixel 2f according to the sixth embodiment, a pixel separating portion 54A completely separating the pixels 2f from each other is formed in a semiconductor substrate 12.

The pixel separating portion 54A is formed by digging a trench penetrating through the semiconductor substrate 12 between N-type semiconductor regions 42 configuring photodiodes PD, forming an aluminum oxide film 113 on an inner surface of the trench, embedding an insulator 55 into the trench at the time of forming a silicon oxide film 114, and further embedding a light shielding object 56 at the time of forming a light shielding film 49 inside the insulator 55. The light shielding object 56 includes a metal having a light shielding property so as to be integrated with the light shielding film 49.

By configuring such a pixel separating portion 54A, adjacent pixels 2f are electrically separated from each other by the insulator 55 embedded in the trench, and are optically separated from each other by the light shielding object 56. Therefore, it is possible to prevent charges generated inside the semiconductor substrate 12 from leaking to the adjacent pixel 2f, and it is possible to prevent light from an oblique direction from leaking to the adjacent pixel 2f.

Then, also in the pixel 2f according to the sixth embodiment, by adopting a pixel structure in which a flat portion 53 is provided, it is possible to suppress generation of diffracted light in a pixel separation region to prevent generation of color mixing.

<Pixel Structure According to Seventh Embodiment>

Figure 13:
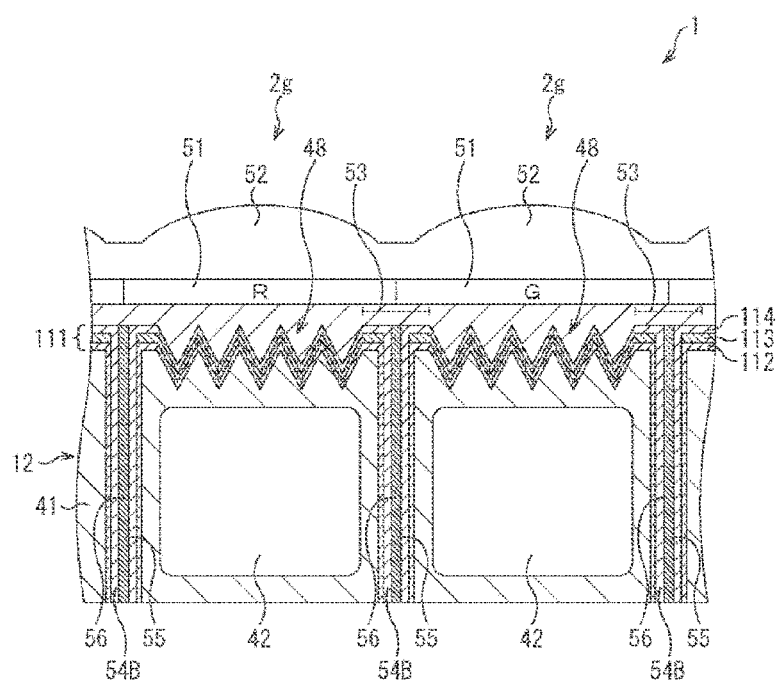
FIG. 13 is a diagram illustrating a cross-sectional configuration example of a pixel according to a seventh embodiment.

FIG. 13 is a diagram illustrating a cross-sectional configuration example of a pixel 2g according to a seventh embodiment.

In FIG. 13, a basic configuration of a solid-state imaging device 1 is common to the configuration illustrated in FIG. 11. In the pixel 2g according to the seventh embodiment, a pixel separating portion 54B completely separating the pixels 2g from each other is formed in a semiconductor substrate 12.

The pixel separating portion 54B is formed by digging a trench penetrating through the semiconductor substrate 12 between N-type semiconductor regions 42 configuring photodiodes PD, forming an aluminum oxide film 113 on an inner surface of the trench, embedding an insulator 55 into the trench at the time of forming a silicon oxide film 114, and further embedding a light shielding object 56 in the trench.

The pixel separating portion 54B of the pixel 2g according to the seventh embodiment differs from the pixel 2f according to the sixth embodiment in that the light shielding film 49 is not provided in the flat portion 53.

By configuring such a pixel separating portion 54B, adjacent pixels 2g are electrically separated from each other by the insulator 55 embedded in the trench, and are optically separated from each other by the light shielding object 56. Therefore, it is possible to prevent charges generated inside the semiconductor substrate 12 from leaking to the adjacent pixel 2g, and it is possible to prevent light from an oblique direction from leaking to the adjacent pixel 2g.

Then, also in the pixel 2g according to the seventh embodiment, by adopting a pixel structure in which the flat portion 53 is provided, it is possible to suppress generation of diffracted light in a pixel separation region to prevent generation of color mixing.

<Pixel Structure According to Eighth Embodiment>

Figure 14:
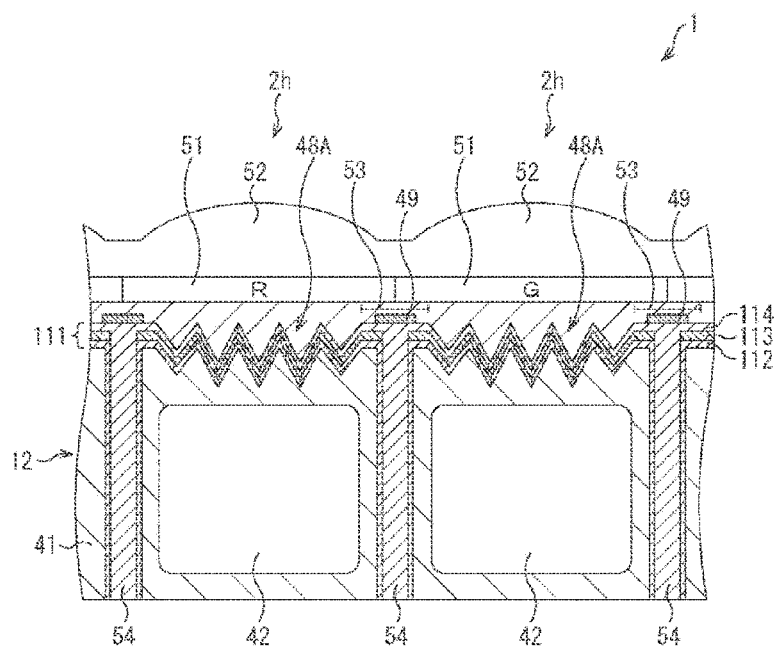
FIG. 14 is a diagram illustrating a cross-sectional configuration example of a pixel according to an eighth embodiment.

FIG. 14 is a diagram illustrating a cross-sectional configuration example of a pixel 2h according to an eighth embodiment.

In FIG. 14, a basic configuration of a solid-state imaging device 1 is common to the configuration illustrated in FIG. 11. In the pixel 2h according to the eighth embodiment, a concave portion region 48A has a shape in which a depth of a concave portion of the concave portion region 48 becomes shallow in the vicinity of the periphery of the pixel 2h, and a pixel separating portion 54 is also formed.

That is, as illustrated in FIG. 14, in the concave portion region 48A, the concave portion configuring the concave portion region 48A is formed to have a shallow depth in a peripheral portion of the pixel 2h, that is, in a portion which is the vicinity of another adjacent pixel 2h, for example, as compared with the concave portion region 48 illustrated in FIG. 11.

As described above, by forming a concave-convex structure at a shallow depth in the peripheral portion of the pixel 2h, it is possible to suppress generation of diffracted light in the peripheral portion of the pixel 2h. Also in the pixel 2h according to the eighth embodiment, by adopting a pixel structure in which a flat portion 53 is provided, it is possible to suppress generation of diffracted light in a pixel separation region to further prevent generation of color mixing.

By forming such a concave portion region 48A, it is possible to suppress the generation of the diffracted light in the peripheral portion of the pixel 2h, and it is possible to electrically separate adjacent pixels 2h from each other by the pixel separating portion 54. Then, also in a sixth variation of a pixel structure, by adopting a pixel structure in which a flat portion 53 is provided, it is possible to suppress generation of diffracted light in a pixel separation region to further prevent generation of color mixing.

<Pixel Structure According to Ninth Embodiment>

Figure 15:
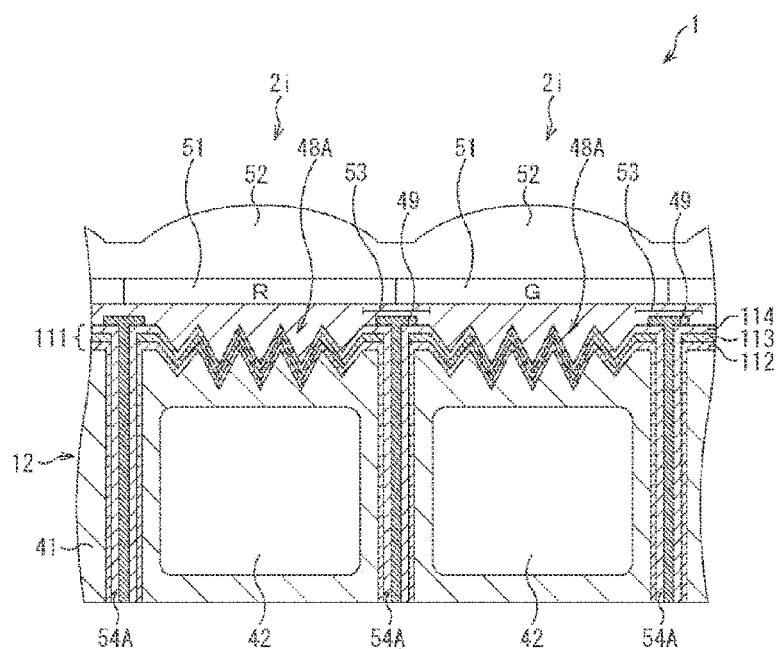
FIG. 15 is a diagram illustrating a cross-sectional configuration example of a pixel according to a ninth embodiment.

FIG. 15 is a diagram illustrating a cross-sectional configuration example of a pixel 2i according to a ninth embodiment.

In FIG. 15, a basic configuration of a solid-state imaging device 1 is common to the configuration illustrated in FIG. 11. In the pixel 2i according to the ninth embodiment, a concave portion region 48A has a shape in which a depth of a concave portion configuring the concave portion region 48A becomes shallow in the vicinity of the periphery of the pixel 2i, and a pixel separating portion 54A is formed.

By forming such a concave portion region 48A, it is possible to suppress generation of diffracted light in a peripheral portion of the pixel 2i, and it is possible to electrically and optically separate adjacent pixels 2i from each other by the pixel separating portion 54A. Then, also in the ninth embodiment of the pixel structure, by adopting a pixel structure in which a flat portion 53 is provided, it is possible to suppress generation of diffracted light in a pixel separation region to further prevent generation of color mixing.

<Pixel Structure According to Tenth Embodiment>

Figure 16:
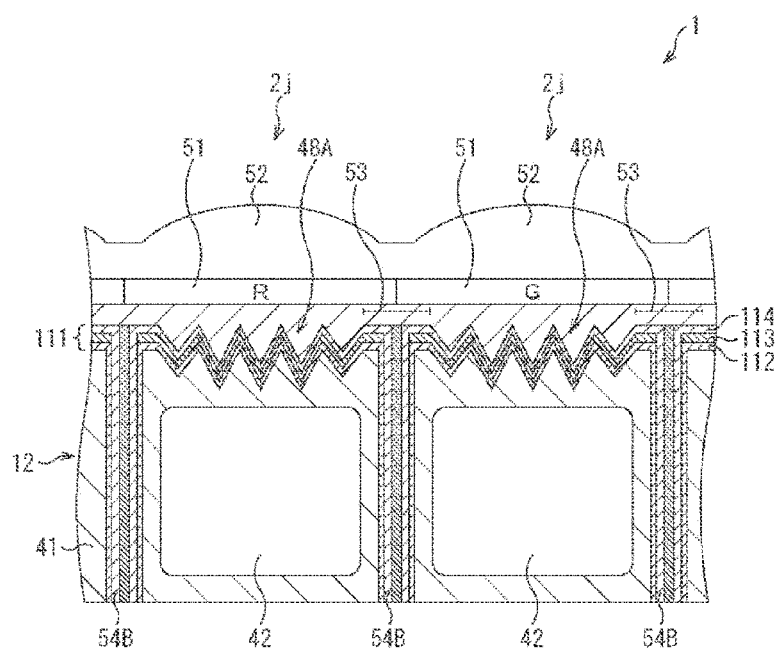
FIG. 16 is a diagram illustrating a cross-sectional configuration example of a pixel according to a tenth embodiment.

FIG. 16 is a diagram illustrating a cross-sectional configuration example of a pixel 2j according to a tenth embodiment.

In FIG. 16, a basic configuration of a solid-state imaging device 1 is common to the configuration illustrated in FIG. 11. In the pixel 2j according to the tenth embodiment, a concave portion region 48A has a shape in which a depth of a concave portion configuring the concave portion region 48A becomes shallow in the vicinity of the periphery of the pixel 2j, and a pixel separating portion 54B is formed.

By forming such a concave portion region 48A, it is possible to suppress generation of diffracted light in a peripheral portion of the pixel 2j, and it is possible to electrically and optically separate adjacent pixels 2j from each other by the pixel separating portion 54B. Then, also in the pixel 2j according to the tenth embodiment, by adopting a pixel structure in which a flat portion 53 is provided, it is possible to suppress generation of diffracted light in a pixel separation region to further prevent generation of color mixing.

<Pixel Structure According to Eleventh Embodiment>

Figure 17:
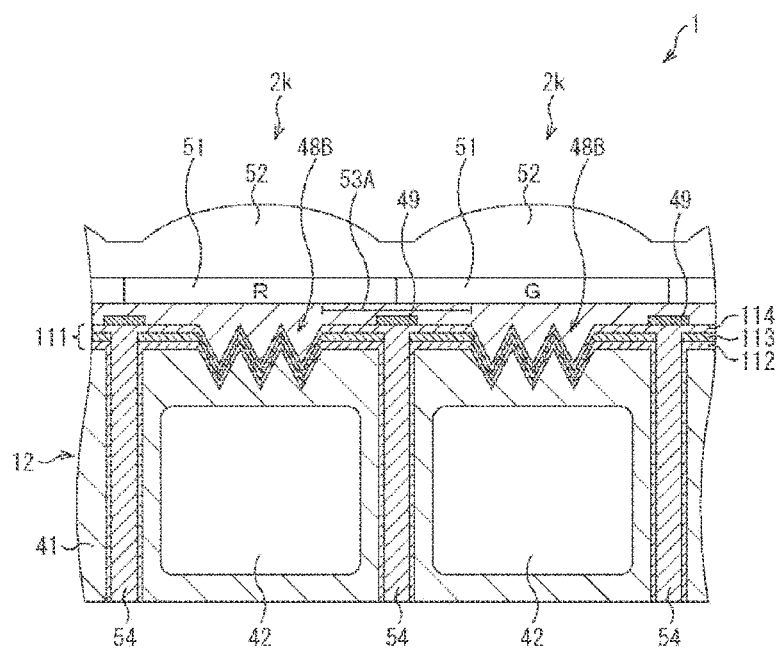
FIG. 17 is a diagram illustrating a cross-sectional configuration example of a pixel according to an eleventh embodiment.

FIG. 17 is a diagram illustrating a cross-sectional configuration example of a pixel 2k according to an eleventh embodiment.

In FIG. 17, a basic configuration of a solid-state imaging device 1 is common to the configuration illustrated in FIG. 11. In the pixel 2k according to the eleventh embodiment, a region in which a concave portion region 48B is formed is narrowed, and a pixel separating portion 54 is formed.

That is, as illustrated in FIG. 17, in the concave portion region 48B, a region forming the concave portion region 48B is reduced in a peripheral portion of the pixel 2k, that is, in a portion which is the vicinity of another adjacent pixel 2k, for example, as compared with the concave portion region 48 illustrated in FIG. 11. Therefore, a flat portion 53A is formed to be wider than the flat portion 53 of FIG. 11.

As described above, by providing the flat portion 53A widely without forming the concave portion region 48B in the peripheral portion of the pixel 2k, it is possible to suppress generation of diffracted light in the peripheral portion of the pixel 2k. Therefore, also in the pixel 2k according to the eleventh embodiment, it is possible to suppress generation of diffracted light in a pixel separation region to further prevent generation of color mixing.

<Pixel Structure According to Twelfth Embodiment>

Figure 18:
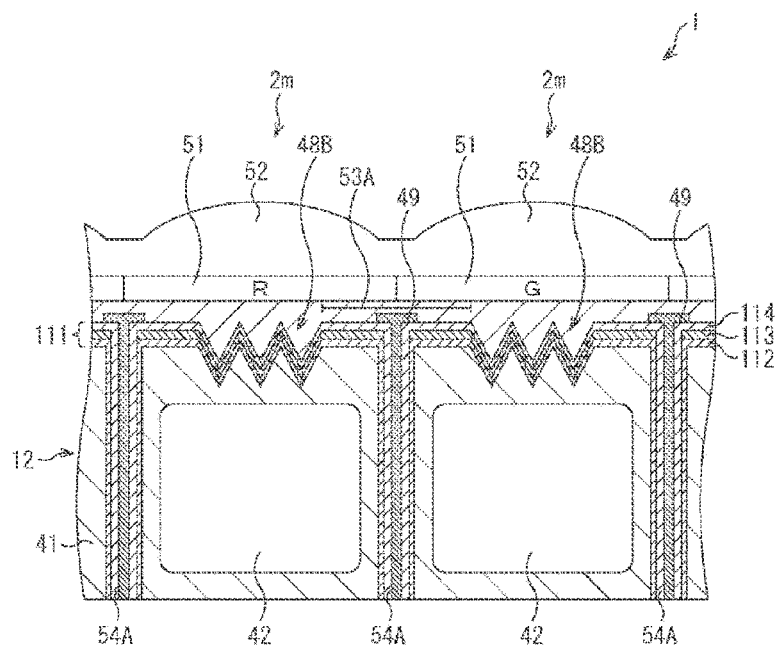
FIG. 18 is a diagram illustrating a cross-sectional configuration example of a pixel according to a twelfth embodiment.

FIG. 18 is a diagram illustrating a cross-sectional configuration example of a pixel 2m according to a twelfth embodiment.

In FIG. 18, a basic configuration of a solid-state imaging device 1 is common to the configuration illustrated in FIG. 11. In the pixel 2m according to the twelfth embodiment, a region in which a concave portion region 48B is formed is narrowed, and a pixel separating portion 54A is formed.

By forming such a concave portion region 48B, it is possible to suppress generation of diffracted light in a peripheral portion of the pixel 2m, and it is possible to electrically and optically separate adjacent pixels 2m from each other by the pixel separating portion 54A. Then, also in the pixel 2m according to the twelfth embodiment, by adopting a pixel structure in which a flat portion 53A is widely provided, it is possible to suppress generation of diffracted light in a pixel separation region to further prevent generation of color mixing.

<Pixel Structure According to Thirteenth Embodiment>

Figure 19:
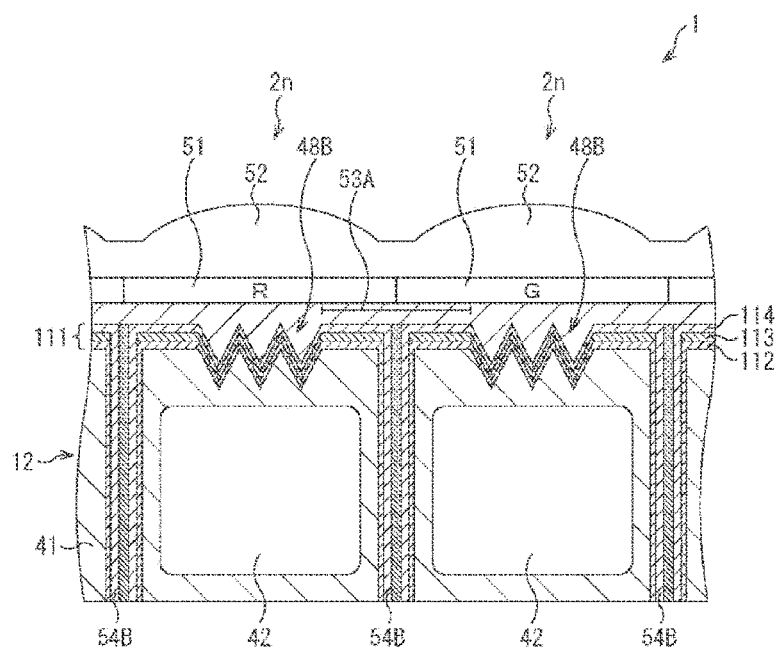
FIG. 19 is a diagram illustrating a cross-sectional configuration example of a pixel according to a thirteenth embodiment.

FIG. 19 is a diagram illustrating a cross-sectional configuration example of a pixel 2n according to a thirteenth embodiment.

In FIG. 19, a basic configuration of a solid-state imaging device 1 is common to the configuration illustrated in FIG. 11. In the pixel 2n according to the thirteenth embodiment, a region in which a concave portion region 48B is formed is narrowed, and a pixel separating portion 54B is formed.

By forming such a concave portion region 48B, it is possible to suppress generation of diffracted light in a peripheral portion of the pixel 2n, and it is possible to electrically and optically separate adjacent pixels 2n from each other by the pixel separating portion 54B. Then, also in a twenty first variation of a pixel structure, by adopting a pixel structure in which a flat portion 53A is widely provided, it is possible to suppress generation of diffracted light in a pixel separation region to further prevent generation of color mixing.

<Application Example to Electronic Apparatus>

The technology of the present disclosure is not limited to being applied to a solid-state imaging device. That is, the technology of the present disclosure can be applied to all electronic apparatus using a solid-state imaging device in an image capturing unit (photoelectric conversion unit), such as an imaging device such as a digital still camera or a video camera, a portable terminal device having an imaging function, or a copy machine using a solid-state imaging device in an image reading unit. The solid-state imaging device may have a form in which it is formed as a single chip or may have a form of a module in which an imaging unit and a signal processing unit or an optical system are packaged together and which has an imaging function.

Figure 20:
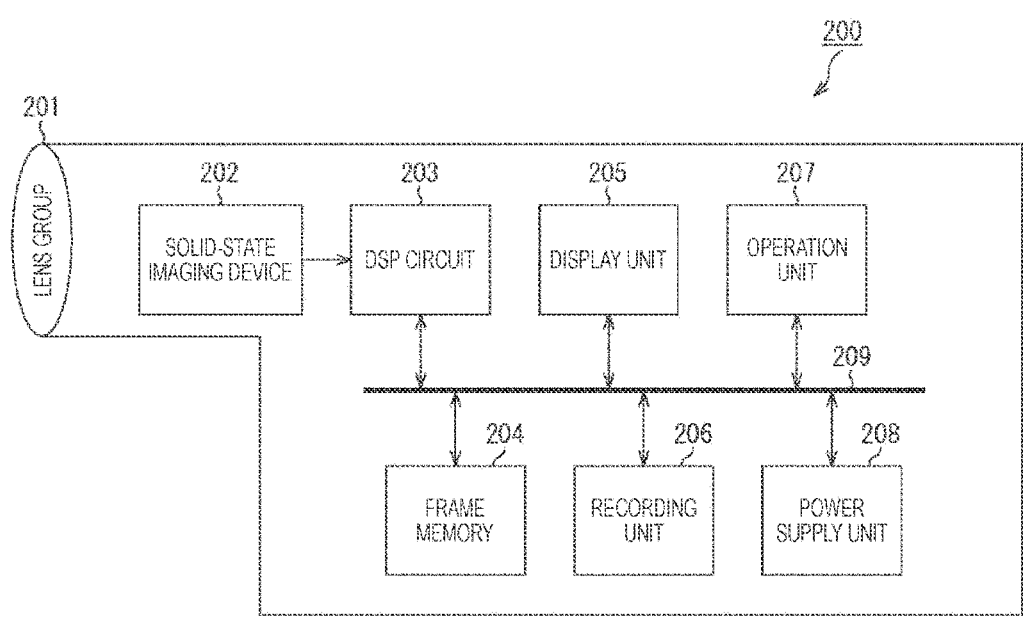
FIG. 20 is a block diagram illustrating a configuration example of an imaging device as an electronic apparatus according to the present disclosure.

FIG. 20 is a block diagram illustrating a configuration example of an imaging device as an electronic apparatus according to the present disclosure.

The imaging device 200 of FIG. 20 includes an optical unit 201 including a lens group and the like, a solid-state imaging device (imaging device) 202 in which the configuration of the solid-state imaging device 1 of FIG. 1 is adopted, and a digital signal processor (DSP) circuit 203 which is a camera signal processing circuit. Furthermore, the imaging device 200 also includes a frame memory 204, a display unit 205, a recording unit 206, an operation unit 207, and a power supply unit 208. The DSP circuit 203, the frame memory 204, the display unit 205, the recording unit 206, the operation unit 207, and the power supply unit 208 are connected to each other via a bus line 209.

The optical unit 201 takes in incident light (image light) from a subject and forms an image on an imaging surface of the solid-state imaging device 202. The solid-state imaging device 202 converts an amount of incident light imaged on the imaging surface by the optical unit 201 into an electric signal in pixel units and outputs the electric signal as a pixel signal. As the solid-state imaging device 202, the solid-state imaging device 1 of FIG. 1, that is, the solid-state imaging device having the improved sensitivity while suppressing the deterioration of the color mixing can be used.

The display unit 205 includes, for example, a panel-type display device such as a liquid crystal panel or an organic electroluminescence (EL) panel, and displays a moving image or a still image captured by the solid-state imaging device 202. The recording unit 206 records the moving image or the still image captured by the solid-state imaging device 202 on a recording medium such as a hard disk or a semiconductor memory.

The operation unit 207 issues operation commands for various functions of the imaging device 200 under an operation of a user. The power supply unit 208 appropriately supplies various types of power that becomes operation power of the DSP circuit 203, the frame memory 204, the display unit 205, the recording unit 206, and the operation unit 207 to these supply targets.

As described above, by using the solid-state imaging device 1 described above as the solid-state imaging device 202, it is possible to improve sensitivity while suppressing deterioration of color mixing. Therefore, also in the imaging device 200 such as a video camera, a digital still camera, and a camera module for a mobile apparatus such as a mobile phone, it is possible to improve image quality of a captured image.

The embodiments of the present disclosure are not limited to the embodiments described above, and various modifications can be made without departing from the scope of the present disclosure.

In the example described above, the solid-state imaging device in which the first conductivity-type is the P-type, the second conductivity-type is the N-type, and electrons are signal charges has been described, but the present disclosure can also be applied to a solid-state imaging device in which holes are signal charges. That is, it is possible to configure each of the semiconductor regions described above by an opposite conductivity-type semiconductor region so that the first conductivity-type is the N-type and the second conductivity-type is the P-type.

Furthermore, the technology of the present disclosure is not limited to being applied to a solid-state imaging device that detects a distribution of an incident light amount of visible light to image the distribution of the incident light amount as an image, and can be applied to all solid-state imaging devices (physical quantity distribution detecting devices) such as a solid-state imaging device that images a distribution of an incident amount of infrared rays, X-rays, particles, or the like, as an image, or a fingerprint detection sensor that detects a distribution of another physical quantity such as pressure or capacitance to image the distribution of another physical quantity as an image in a broad sense.

<Application Example to Endoscopic Surgery System>

The technology according to the present disclosure (the present technology) can be applied to various products. For example, the technology according to the present disclosure may be applied to an endoscopic surgery system.

Figure 21:
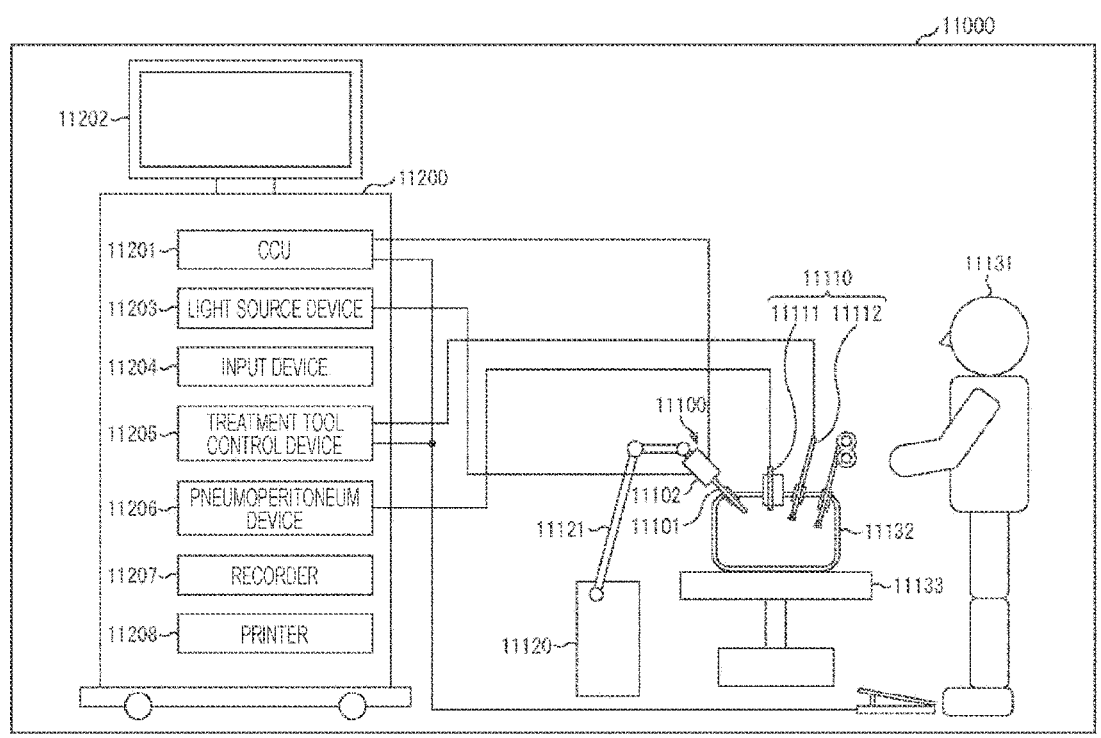
FIG. 21 is a diagram illustrating an example of a schematic configuration of an endoscopic surgery system.

FIG. 21 is a view illustrating an example of a schematic configuration of an endoscopic surgery system to which the technology according to the present disclosure (the present technology) can be applied.

In FIG. 21, an aspect in which an operator (surgeon) 11131 performs surgery on a patient 11132 on a patient bed 11133 using an endoscopic surgery system 11000 is illustrated. As illustrated in FIG. 21, the endoscopic surgery system 11000 includes an endoscope 11100, other surgical tools 11110 such as a pneumoperitoneum tube 11111 or an energy treatment tool 11112, a support arm device 11120 supporting the endoscope 11100, and a cart 11200 on which various devices for endoscopic surgery are mounted.

The endoscope 11100 includes a lens barrel 11101 whose region of a predetermined length from a tip is inserted into the body cavity of the patient 11132, and a camera head 11102 connected to a base end of the lens barrel 11101. The endoscope 11100 configured as a so-called rigid scope having a rigid lens barrel 11101 is illustrated in the illustrated example, but the endoscope 11100 may be configured as a so-called flexible scope having a flexible lens barrel.

An opening into which an objective lens is fitted is provided at the tip of the lens barrel 11101. A light source device 11203 is connected to the endoscope 11100, such that light generated by the light source device 11203 is guided up to the tip of the lens barrel by a light guide extended inside the lens barrel 11101 and is irradiated toward an observation target in the body cavity of the patient 11132 via the objective lens. Note that the endoscope 11100 may be a forward-viewing endoscope or may be an oblique-viewing endoscope or a side-viewing endoscope.

An optical system and an imaging element are provided inside the camera head 11102, and reflected light (observation light) from the observation target is condensed on the imaging element by the optical system. The observation light is photoelectrically converted by the imaging element, such that an electric signal corresponding to the observation light, that is, an image signal corresponding to an observation image is generated. The image signal is transmitted as RAW data to a camera control unit (CCU) 11201.

The CCU 11201 includes a central processing unit (CPU), a graphics processing unit (GPU), or the like, and comprehensively controls operations of the endoscope 11100 and a display device 11202. Moreover, the CCU 11201 receives the image signal from the camera head 11102 and performs various image processing for displaying an image based on the image signal, such as development processing (demosaic processing) and the like, on the image signal.

The display device 11202 displays the image based on the image signal on which the image processing is performed by the CCU 11201, under control of the CCU 11201.

The light source device 11203 includes a light source such as, for example, a light emitting diode (LED), and supplies irradiated light to the endoscope 11100 at the time of imaging a surgical site or the like.

The input device 11204 is an input interface for the endoscopic surgery system 11000. A user can input various information or various instructions to the endoscopic surgery system 11000 via the input device 11204. For example, the user inputs an instruction to change imaging conditions (a type of irradiated light, a magnification, a focal length, and the like) by the endoscope 11100, and the like.

A treatment tool control device 11205 controls the drive of the energy treatment tool 11112 for cautery and incision of tissue, sealing of a blood vessel, or the like. A pneumoperitoneum device 11206 sends a gas into the body cavity via the pneumoperitoneum tube 11111 in order to inflate the body cavity of the patient 11132 for the purpose of securing a visual field by the endoscope 11100 and securing a working space of the operator. A recorder 11207 is a device capable of recording various information regarding the surgery. A printer 11208 is a device capable of printing the various information regarding the surgery in various formats such as a text, an image, or a graph.

Note that the light source device 11203 that supplies the irradiated light at the time of imaging the surgical site to the endoscope 11100 can include, for example, a white light source including an LED, a laser light source, or a combination thereof. In a case where the white light source includes a combination of RGB laser light sources, it is possible to control an output intensity and an output timing of each color (each wavelength) with a high accuracy, and it is thus possible to adjust a white balance of a captured image in the light source device 11203. Furthermore, in this case, by irradiating laser light from each of the RGB laser light sources to the observation target in a time division manner and controlling the drive of the imaging element of the camera head 11102 in synchronization with an irradiation timing of the laser light, it is also possible to capture images corresponding to each of RGB in a time division manner. According to such a method, it is possible to obtain a color image without providing a color filter to the imaging element.

Furthermore, the drive of the light source device 11203 may be controlled so as to change an intensity of light output by the light source device 11203 every predetermined time. By controlling the drive of the imaging element of the camera head 11102 in synchronization with a timing of the change in the intensity of the light to acquire images in a time division manner and synthesizing the images with each other, it is possible to generate a high dynamic range image without a so-called black spot and white spot.

Furthermore, the light source device 11203 may be configured to be able to supply light of a predetermined wavelength band corresponding to special light observation. In the special light observation, for example, so-called narrow band imaging in which a predetermined tissue such as a blood vessel in a mucous membrane surface layer is imaged with high contrast by irradiating light of a narrow band as compared with irradiated light (that is, white light) at the time of normal observation using wavelength dependency of absorption of light in a body tissue is performed. Alternatively, in the special light observation, fluorescence observation in which an image is obtained by fluorescence generated by irradiating excitation light may be performed. In the fluorescence observation, it can be performed to irradiate excitation light to a body tissue and observe fluorescence from the body tissue (self-fluorescence observation) or locally inject a reagent such as indocyanine green (ICG) or the like to the body tissue and irradiate excitation light corresponding to a fluorescence wavelength of the reagent to the body tissue to obtain a fluorescence image. The light source device 11203 can be configured to be able to supply the light of the narrow band and/or the excitation light corresponding to such special light observation.

Figure 22:
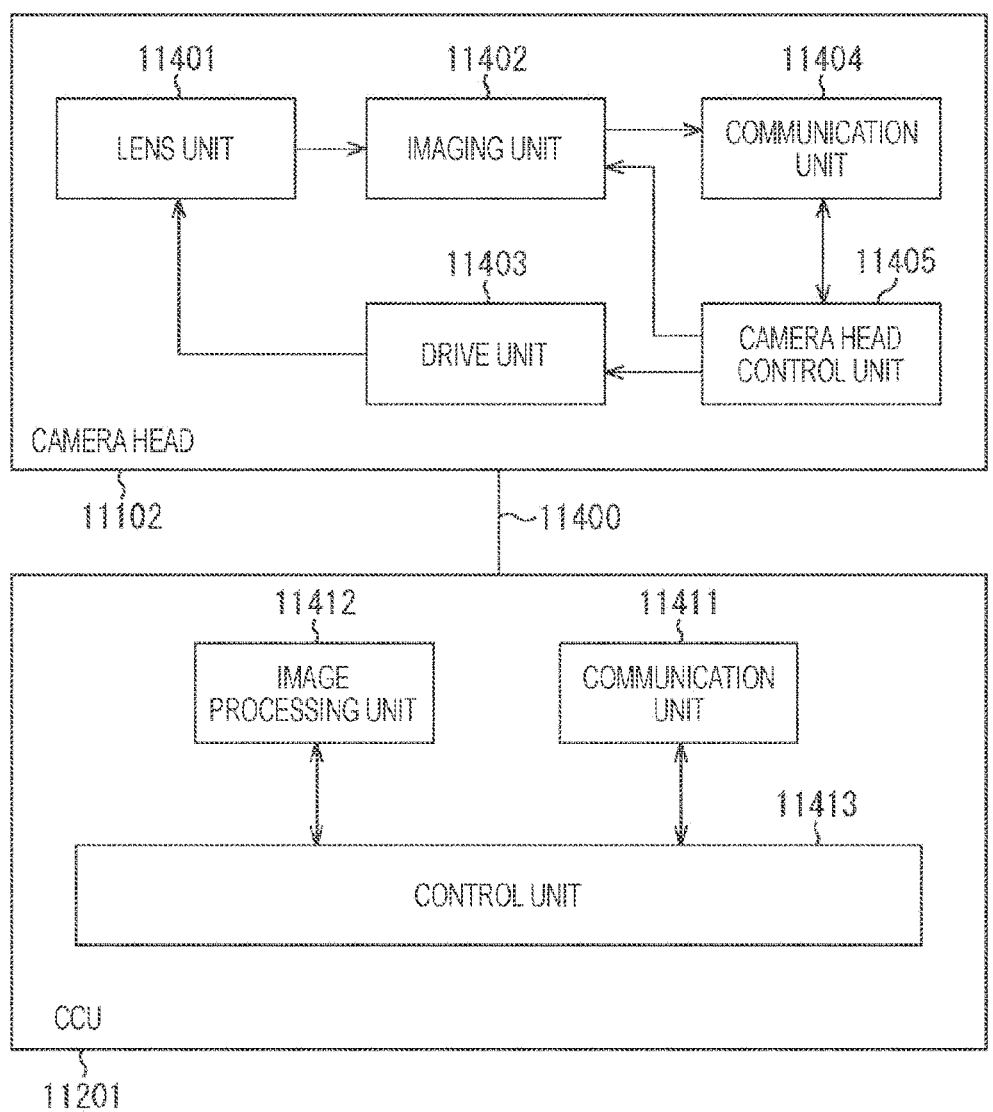
FIG. 22 is a block diagram illustrating an example of functional configurations of a camera head and a camera control unit (CCU).

FIG. 22 is a block diagram illustrating an example of functional configurations of the camera head 11102 and the CCU 11201 illustrated in FIG. 21.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are communicably connected to each other by a transmission cable 11400.

The lens unit 11401 is an optical system provided at a connected portion with the lens barrel 11101. Observation light taken in from the tip of the lens barrel 11101 is guided to the camera head 11102 and is incident on the lens unit 11401. The lens unit 11401 is configured by combining a plurality of lenses including a zoom lens and a focus lens with each other.

The number of imaging elements configuring the imaging unit 11402 may be one (a so-called single-plate type) or may be plural (a so-called multi-plate type). In a case where the imaging unit 11402 is configured in the multi-plate type, for example, image signals corresponding to each of RGB may be generated by each imaging element, and may be synthesized with each other to obtain a color image. Alternatively, the imaging unit 11402 may include a pair of imaging elements for acquiring respectively image signals for a right eye and a left eye corresponding to a three-dimensional (3D) display. By performing the 3D display, the operator 11131 can more accurately grasp a depth of a biological tissue in the surgical site. Note that in a case where the imaging unit 11402 is configured in the multi-plate type, a plurality of lens units 11401 may be provided to correspond to the respective imaging elements.

Furthermore, the imaging unit 11402 does not need to be necessarily provided in the camera head 11102. For example, the imaging unit 11402 may be provided immediately after the objective lens, inside the lens barrel 11101.

The drive unit 11403 includes an actuator, and moves the zoom lens and the focus lens of the lens unit 11401 by a predetermined distance along an optical axis under control of the camera head control unit 11405. Therefore, a magnification and a focus of the captured image by the imaging unit 11402 can be appropriately adjusted.

The communication unit 11404 includes a communication device for transmitting and receiving various information to and from the CCU 11201. The communication unit 11404 transmits the image signal obtained from the imaging unit 11402 as RAW data to the CCU 11201 via the transmission cable 11400.

Furthermore, the communication unit 11404 also receives a control signal for controlling the drive of the camera head 11102 from the CCU 11201 and supplies the control signal to the camera head control unit 11405. The control signal includes, for example, information regarding imaging conditions such as information indicating that a frame rate of the captured image is designated, information indicating that an exposure value at the time of capturing the image is designated, and/or information indicating that a magnification and a focus of the captured image are designated.

Note that the imaging conditions such as the frame rate, the exposure value, the magnification, and the focus, described above may be appropriately designated by the user or may be automatically set by the control unit 11413 of the CCU 11201 on the basis of the acquired image signal. In the latter case, a so-called auto exposure (AE) function, an auto focus (AF) function, and an auto white balance (AWB) function are mounted in the endoscope 11100.

The camera head control unit 11405 controls the drive of the camera head 11102 on the basis of the control signal from the CCU 11201 received via the communication unit 11404.

The communication unit 11411 includes a communication device for transmitting and receiving various information to and from the camera head 11102. The communication unit 11411 receives the image signal transmitted from the camera head 11102 via the transmission cable 11400.

Furthermore, the communication unit 11411 transmits the control signal for controlling the drive of the camera head 11102 to the camera head 11102. The image signal or the control signal can be transmitted by telecommunication, optical communication or the like.

The image processing unit 11412 performs various image processing on the image signal, which is the RAW data transmitted from the camera head 11102.

The control unit 11413 performs various controls related to imaging of the surgical site or the like by the endoscope 11100 and display of the captured image obtained by the imaging of the surgical site or the like. For example, the control unit 11413 generates the control signal for controlling the drive of the camera head 11102.

Furthermore, the control unit 11413 causes the display device 11202 to display the captured image in which the surgical site or the like is imaged, on the basis of the image signal on which the image processing is performed by the image processing unit 11412. At this time, the control unit 11413 may recognize various objects in the captured image using various image recognition technologies. For example, the control unit 11413 can recognize a surgical tool such as forceps, a specific biological site, bleeding, mist at the time of using the energy treatment tool 11112, and the like, by detecting a shape, a color, or the like of an edge of an object included in the captured image. The control unit 11413 may cause various surgical support information to be superimposed and displayed on an image of the surgical site using a result of the recognition, when the control unit 11413 causes the display device 11202 to display the captured image. The operation support information is superimposed and disposed and is presented to the operator 11131, such that a burden on the operator 11131 can be reduced or the operator 11131 can certainly perform the surgery.

The transmission cable 11400 connecting the camera head 11102 and the CCU 11201 to each other is an electric signal cable corresponding to communication of an electric signal, an optical fiber corresponding to optical communication, or a composite cable of the electric signal cable and the optical fiber.

Here, communication has been performed in a wired manner using the transmission cable 11400 in the illustrated example, but communication between the camera head 11102 and the CCU 11201 may be performed in a wireless manner.

<Application Example to Moving Body>

The technology according to the present disclosure (the present technology) can be applied to various products. For example, the technology according to the present disclosure may be realized as a device mounted in any type of moving body such as a vehicle, an electric vehicle, a hybrid electric vehicle, a motorcycle, a bicycle, a personal mobility, an airplane, a drone, a ship, and a robot.

Figure 23:
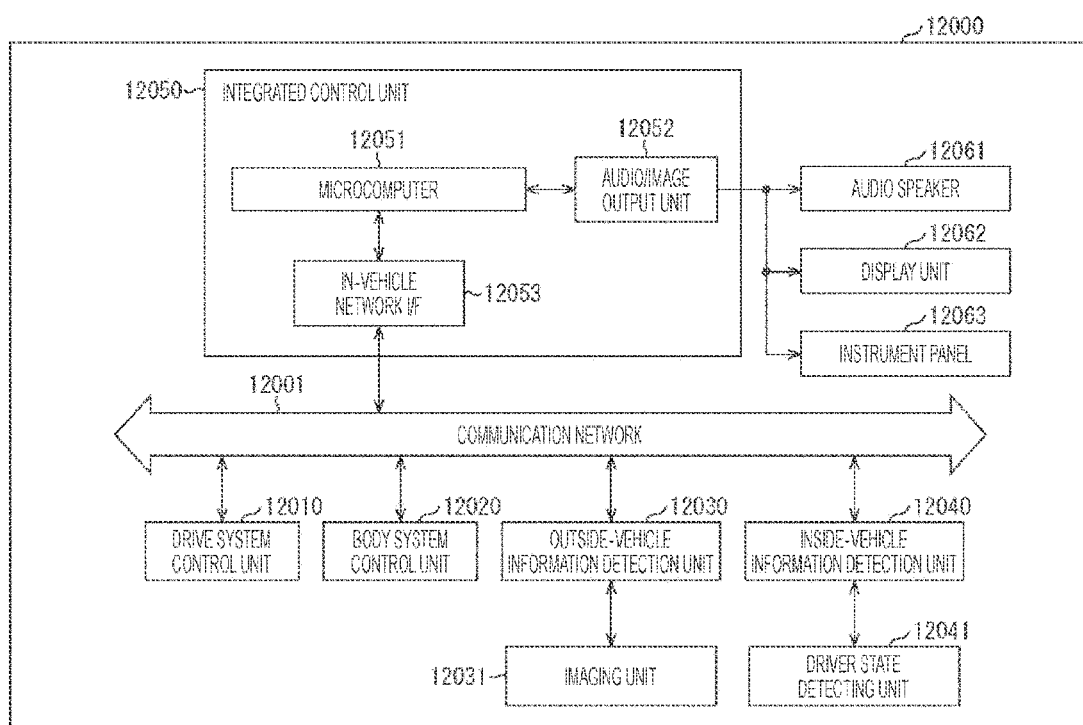
FIG. 23 is a block diagram illustrating an example of a schematic configuration of a vehicle control system.

FIG. 23 is a block diagram illustrating a schematic configuration example of a vehicle control system which is an example of a moving body control system to which the technology according to the present disclosure can be applied.

A vehicle control system 12000 includes a plurality of electronic control units connected to each other via a communication network 12001. In the example illustrated in FIG. 23, the vehicle control system 12000 includes a drive system control unit 12010, a body system control unit 12020, an outside-vehicle information detection unit 12030, an inside-vehicle information detection unit 12040, and an integrated control unit 12050. Furthermore, as a functional configuration of the integrated control unit 12050, a microcomputer 12051, an audio/image output unit 12052, and an in-vehicle network interface (I/F) 12053 are illustrated.

The drive system control unit 12010 controls operations of devices related to a drive system of the vehicle according to various programs. For example, the drive system control unit 12010 functions as a control device of a driving force generation device for generating a driving force of the vehicle, such as an internal combustion engine, a drive motor, or the like, a driving force transfer mechanism for transferring the driving force to wheels, a steering mechanism for adjusting a steering angle of the vehicle, and a braking device for generating a braking force of the vehicle.

The body system control unit 12020 controls operations of various devices mounted on a vehicle body according to various programs. For example, the body system control unit 12020 functions as a control device of a keyless entry system, a smart key system, a power window device, or various lamps such as a headlamp, a back lamp, a brake lamp, a blinker, and a fog lamp. In this case, electric waves or signals of various switches transmitted from a portable device substituting for a key can be input to the body system control unit 12020. The body system control unit 12020 receives inputs of these electric waves or signals, and controls a door lock device, a power window device, a lamp, and the like of the vehicle.

The outside-vehicle information detection unit 12030 detects information regarding the outside of the vehicle in which the vehicle control system 12000 is mounted. For example, an imaging unit 12031 is connected to the outside-vehicle information detection unit 12030. The outside-vehicle information detection unit 12030 causes the imaging unit 12031 to capture a vehicle external image, and receives the captured image. The outside-vehicle information detection unit 12030 may perform object detection processing or distance detection processing of a person, a vehicle, an obstacle, a sign, characters on a road surface, or the like on the basis of the received image.

The imaging unit 12031 is an optical sensor receiving light and outputting an electric signal depending on an amount of received light. The imaging unit 12031 can output the electric signal as an image or can output the electric signal as measured distance information. Furthermore, the light received by the imaging unit 12031 may be visible light or may be non-visible light such as infrared light.

The inside-vehicle information detection unit 12040 detects information regarding the inside of the vehicle. For example, a driver state detecting unit 12041 detecting a state of a driver is connected to the inside-vehicle information detection unit 12040. The driver state detecting unit 12041 includes, for example, a camera imaging the driver, and the inside-vehicle information detection unit 12040 may calculate a fatigue degree or a concentration degree of the driver or may determine whether or not the driver is dozing, on the basis of detected information input from the driver state detecting unit 12041.

The microcomputer 12051 can calculate a control target value of the driving force generation device, the steering mechanism, or the braking device on the basis of the information regarding the inside or the outside of the vehicle acquired by the outside-vehicle information detection unit 12030 or the inside-vehicle information detection unit 12040 and output a control command to the drive system control unit 12010. For example, the microcomputer 12051 can perform cooperation control for the purpose of realizing a function of an advanced driver assistance system (ADAS) including collision avoidance or shock mitigation of the vehicle, following traveling based on an inter-vehicle distance, vehicle speed maintenance traveling, collision warning of the vehicle, lane departure warning of the vehicle, and the like.

Furthermore, the microcomputer 12051 can perform cooperative control for the purpose of automatic driving or the like in which the vehicle autonomously travels without depending on a driver's operation by controlling the driving force generating device, the steering mechanism, the braking device, or the like, on the basis of the surrounding information of the vehicle acquired by the outside-vehicle information detection unit 12030 or the inside-vehicle information detection unit 12040.

Furthermore, the microcomputer 12051 can output a control command to the body system control unit 12030 on the basis of the information regarding the outside of the vehicle acquired by the outside-vehicle information detection unit 12030. For example, the microcomputer 12051 can perform cooperative control for the purpose of achieving antiglare such as switching a high beam into a low beam by controlling the headlamp depending on a position of the preceding vehicle or an oncoming vehicle detected by the outside-vehicle information detection unit 12030.

The audio/image output unit 12052 transmits at least one of an audio output signal or an image output signal to an output device capable of visually or auditorily notifying the passenger of the vehicle or the outside of the vehicle of information. In the example of FIG. 23, an audio speaker 12061, a display unit 12062, and an instrument panel 12063 are exemplified as the output device. The display unit 12062 may include, for example, at least one of an on-board display or a head-up display.

Figure 24:
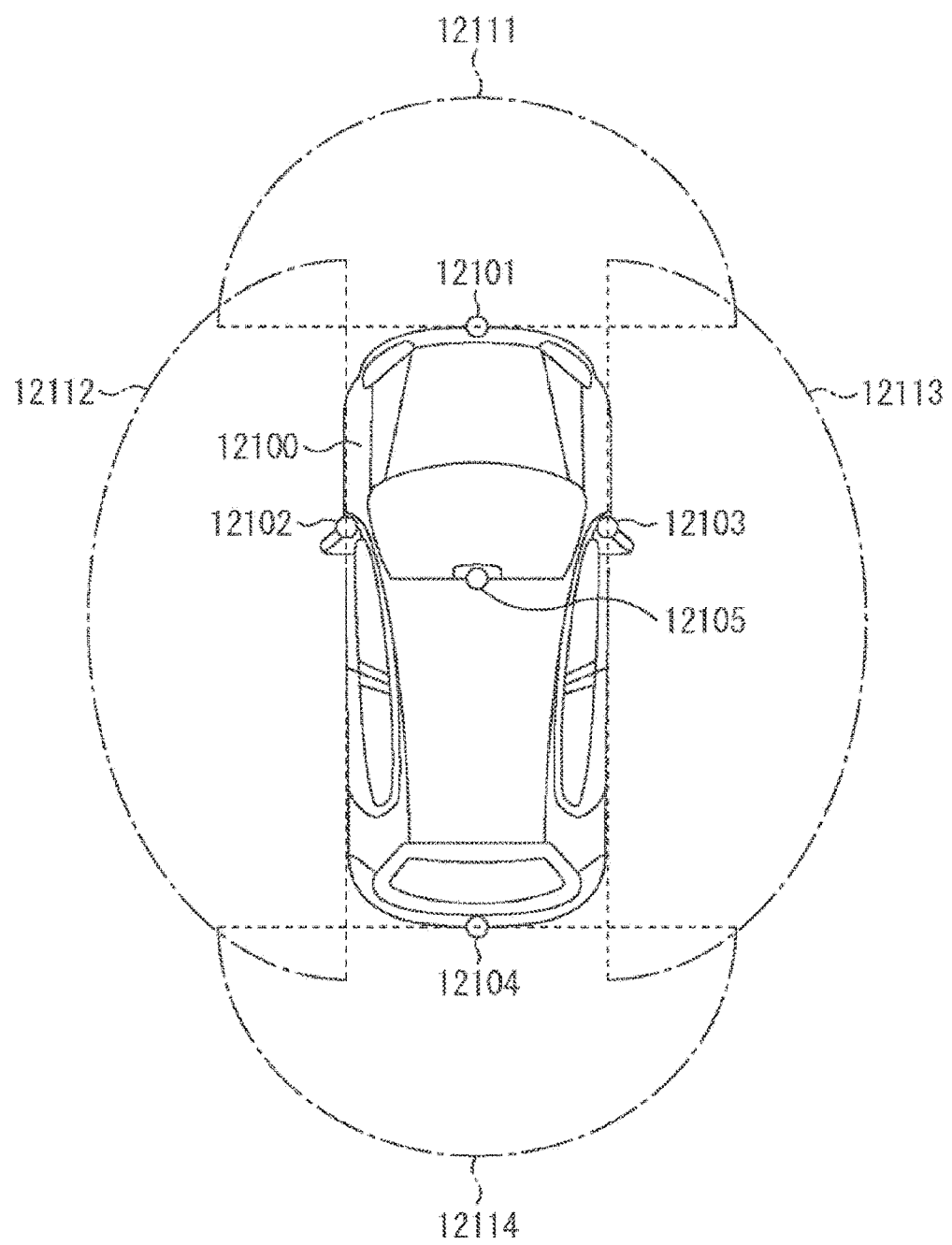
FIG. 24 is an explanatory diagram illustrating an example of installation positions of an outside-vehicle information detection unit and an imaging unit.

FIG. 24 is a view illustrating an example of an installation position of the imaging unit 12031.

In FIG. 24, a vehicle 12100 includes imaging units 12101, 12102, 12103, 12104, and 12105 as the imaging unit 12031.

The imaging units 12101, 12102, 12103, 12104, and 12105 are provided, for example, at positions such as a front nose, side mirrors, a rear bumper, a back door, and an upper portion of a windshield of a vehicle interior, of the vehicle 12100. The imaging unit 12101 provided on the front nose and the imaging unit 12105 provided on the upper portion of the windshield of the vehicle interior mainly acquire images of a region in front of the vehicle 12100. The imaging units 12102 and 12103 provided on the side mirrors mainly acquire images of side regions of the vehicle 12100. The imaging units 12104 provided on the rear bumper or the back door mainly acquire an image of a region behind the vehicle 12100. The imaging unit 12105 provided on the upper portion of the windshield in the vehicle interior is mainly used to detect preceding vehicles, pedestrians, obstacles, traffic lights, traffic signs, lanes, or the like.

Note that FIG. 24 illustrates an example of imaging ranges of the imaging units 12101 to 12104. An imaging range 12111 indicates an imaging range of the imaging unit 12101 provided on the front nose, imaging ranges 12112 and 12113 indicate imaging ranges of the imaging units 12102 and 12103 provided on the side mirrors, respectively, and an imaging range 12114 indicates an imaging range of the imaging unit 12104 provided in the rear bumper or the back door. For example, by overlaying image data captured by the imaging units 12101 to 12104 with each other, a bird's eye view image of the vehicle 12100 viewed from above can be obtained.

At least one of the imaging units 12101 to 12104 may have a function of acquiring distance information. For example, at least one of the imaging units 12101 to 12104 may be a stereo camera including a plurality of imaging elements or may be an imaging element having pixels for detecting a phase difference.

For example, the microcomputer 12051 can extract, in particular, a three-dimensional object that is the closest three-dimensional object on a traveling road of the vehicle 12100 and travels at a predetermined speed (for example, 0 km/h or more) in a direction that is substantially the same as that of the vehicle 12100 as the preceding vehicle by calculating a distance to each three-dimensional object in the imaging ranges 12111 to 12114 and a temporal change (relative speed to the vehicle 12100) in this distance on the basis of the distance information acquired from the imaging units 12101 to 12104. Moreover, the microcomputer 12051 can set an inter-vehicle distance to be secured in advance in front of the preceding vehicle and perform automatic brake control (including following stop control), automatic acceleration control (including following start control), and the like. As described above, it is possible to perform the cooperative control for the purpose of the automatic driving or the like in which the vehicle autonomously travels without depending on the driver's operation.

For example, the microcomputer 12051 can classify and extract three-dimensional object data regarding the three-dimensional objects into other three-dimensional objects such as a two-wheeled vehicle, an ordinary vehicle, a large vehicle, a pedestrian, and a telephone pole, on the basis of the distance information acquired from the imaging units 12101 to 12104, and use the three-dimensional object data for automatic avoidance of an obstacle. For example, the microcomputer 12051 identifies obstacles around the vehicle 12100 as obstacles visible to the driver of the vehicle 12100 and obstacles invisible to the driver of the vehicle 12100. Then, the microcomputer 12051 can perform driving support for collision avoidance by determining a collision risk indicating a risk of collision with each obstacle and outputting a warning to the driver via the audio speaker 12061 or the display unit 12062 or performing forced deceleration or avoidance steering via the drive system control unit 12010 in a situation where the collision risk is a set value or more, such that there is a possibility of collision.

At least one of the imaging units 12101 to 12104 may be an infrared camera detecting infrared light. For example, the microcomputer 12051 can recognize a pedestrian by determining whether or not the pedestrian is present in the images captured by the imaging units 12101 to 12104. Such recognition of the pedestrian is performed by, for example, a procedure for extracting feature points in images captured by the imaging units 12101 to 12104 as the infrared camera and a procedure of performing pattern matching processing on a series of feature points indicating an outline of an object to distinguish whether or not the object is the pedestrian. When the microcomputer 12051 determines that the pedestrian is present in the images captured by the imaging units 12101 to 12104 and recognizes the pedestrian, the audio/image output unit 12052 controls the display unit 12062 to superimpose and display a rectangular outline for emphasizing the recognized pedestrian. Furthermore, the audio/image output unit 12052 may control the display unit 12062 to display an icon or the like indicating the pedestrian on a desired position.

In the present specification, a system refers to an entire device including a plurality of devices.

Note that effects described in the present specification are merely examples and are not limited, and other effects may be provided.

Note that the embodiments of the present technology are not limited to the embodiments described above, and various modifications can be made without departing from the scope of the present technology.

Note that the present technology can also have the following configuration.

(1)

A solid-state imaging device including:
a substrate;
a first photoelectric conversion region that is provided in the substrate;
a second photoelectric conversion region that is provided in the substrate;
a trench that is provided between the first photoelectric conversion region and the second photoelectric conversion region and penetrates through the substrate;
a first concave portion region that has a plurality of concave portions provided on a light receiving surface side of the substrate, above the first photoelectric conversion region; and
a second concave portion region that has a plurality of concave portions provided on the light receiving surface side of the substrate, above the second photoelectric conversion region.

(2)

The solid-state imaging device according to the above (1), in which an insulating film is formed in the trench.

(3)

The solid-state imaging device according to the above (1) or (2), in which the trench is filled with a metal material.

(4)

The solid-state imaging device according to the above (2), in which a pinning layer is stacked between the substrate and the insulating film.

(5)

The solid-state imaging device according to the above (2), in which an antireflection film is stacked between substrate and the insulating film.

(6)

The solid-state imaging device according to any one of the above (1) to (5), in which the concave portion region is formed at a central portion of a pixel, the central portion of the pixel being a region of a predetermined ratio to a pixel region.

(7)

The solid-state imaging device according to any one of the above (1) to (5), in which the concave portion region is formed at a central portion of a pixel, the central portion of the pixel being a region of 80% of a pixel region.

(8)

The solid-state imaging device according to any one of the above (1) to (7), in which a flat portion of a predetermined width in which the concave portion region is not formed is provided between pixels on the light receiving surface side.

(9)

An electronic apparatus including:
a solid-state imaging device including:
a substrate;
a first photoelectric conversion region that is provided in the substrate;
a second photoelectric conversion region that is provided in the substrate;

a trench that is provided between the first photoelectric conversion region and the second photoelectric conversion region and penetrates through the substrate;
a first concave portion region that has a plurality of concave portions provided on a light receiving surface side of the substrate, above the first photoelectric conversion region; and
a second concave portion region that has a plurality of concave portions provided on the light receiving surface side of the substrate, above the second photoelectric conversion region.

REFERENCE SIGNS LIST

1 Solid-state imaging device
2 Pixel
3 Pixel array unit
12 Semiconductor substrate
41, 42 Semiconductor region
45 Pinning layer
46 Transparent insulating film
47 Inter-pixel lighting shielding portion
48 Antireflection portion
49 Light shielding film
50 Flattening film
51 Color filter layer
52 On-chip lens
101 Metal light shielding portion
200 Imaging device
202 Solid-state imaging device

The invention claimed is:

1. A light detecting device, comprising:
a substrate, wherein the substrate includes:
    a light receiving surface side configured to receive incident light; and
    a back surface side opposite to the light receiving surface;
a wiring layer on the back surface side of the substrate;
a first photoelectric conversion region in the substrate;
a second photoelectric conversion region in the substrate, wherein the second photoelectric conversion region is adjacent to the first photoelectric conversion region in a cross-sectional view;
a trench between the first photoelectric conversion region and the second photoelectric conversion region, wherein the trench penetrates through the substrate to reach the wiring layer on the back surface side of the substrate;
a material disposed in the trench;
a first concave portion region that has a plurality of first concave portions on the light receiving surface side of the substrate, wherein the first concave portion region is above the first photoelectric conversion region;
a second concave portion region that has a plurality of second concave portions on the light receiving surface side of the substrate, wherein the second concave portion region is above the second photoelectric conversion region; and
a film including hafnium on the first concave portion region, the second concave portion region, and the material, wherein the film is undisposed in the trench.

2. The light detecting device according to claim 1, wherein the material disposed in the trench is an insulating film.
3. The light detecting device according to claim 2, wherein the film is stacked between the substrate and the insulating film.
4. The light detecting device according to claim 2, wherein an antireflection film is stacked between the substrate and the insulating film.
5. The light detecting device according to claim 1, wherein the material disposed in the trench is a metal.
6. The light detecting device according to claim 1, wherein
the first concave portion region is at a central portion of a first pixel, and
the central portion of the first pixel is a region of a specific ratio to a first pixel region.
7. The light detecting device according to claim 1, wherein
the first concave portion region is at a central portion of a first pixel, and
the central portion of the first pixel is a region of 80% of a first pixel region.
8. The light detecting device according to claim 1, wherein a flat portion of a specific width, in which each of the first concave portion region and the second concave portion region is not formed, is between pixels on the light receiving surface side.
9. An electronic apparatus, comprising:
a light detecting device including:
    a substrate, wherein the substrate includes:
        a light receiving surface side configured to receive incident light; and
        a back surface side opposite to the light receiving surface;
    a wiring layer on the back surface side of the substrate;
    a first photoelectric conversion region in the substrate;
    a second photoelectric conversion region in the substrate, wherein the second photoelectric conversion region is adjacent to the first photoelectric conversion region in a cross-sectional view;
    a trench between the first photoelectric conversion region and the second photoelectric conversion region, wherein the trench penetrates through the substrate to reach the wiring layer on the back surface side of the substrate;
    a material disposed in the trench;
    a first concave portion region that has a plurality of first concave portions on the light receiving surface side of the substrate, wherein the first concave portion region is above the first photoelectric conversion region;
    a second concave portion region that has a plurality of second concave portions on the light receiving surface side of the substrate, wherein the second concave portion region is above the second photoelectric conversion region; and
    a film including hafnium on the first concave portion region, the second concave portion region, and the material, wherein the film is undisposed in the trench.

* * * * *